US012660431B2

(12) United States Patent　　　　(10) Patent No.:　US 12,660,431 B2

Choo et al.　　　　　　　　　　　(45) Date of Patent:　　Jun. 16, 2026

(54) MANUFACTURING METHOD FOR REDUCING SURFACE STEP OF A PASSIVATION LAYER

(71) Applicant: Samsung Display Co., Ltd., Yongin-Si (KR)

(72) Inventors: Byoung Kwon Choo, Hwaseong-si (KR); Seung Bae Kang, Suwon-si (KR); Bong Gu Kang, Seoul (KR); Tae Joon Kim, Seoul (KR); Jeong Min Park, Seoul (KR); Joon-Hwa Bae, Suwon-si (KR); Hee Sung Yang, Hwaseong-si (KR); Woo Jin Cho, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 124 days.

(21) Appl. No.: 18/628,242

(22) Filed: Apr. 5, 2024

(65) Prior Publication Data

US 2024/0251607 A1　　　Jul. 25, 2024

Related U.S. Application Data

(62) Division of application No. 17/332,933, filed on May 27, 2021, now Pat. No. 11,985,865.

(30) Foreign Application Priority Data

Sep. 8, 2020　　(KR) ........................ 10-2020-0114909

(51) Int. Cl.
　　*H10K 59/124*　　　(2023.01)
　　*H10K 59/12*　　　(2023.01)

*H10K 59/123*　　　(2023.01)
*H10K 59/38*　　　(2023.01)
*H10K 59/40*　　　(2023.01)
*H10K 59/80*　　　(2023.01)

(52) U.S. Cl.
　　CPC ......... *H10K 59/124* (2023.02); *H10K 59/123* (2023.02); *H10K 59/38* (2023.02); *H10K 59/40* (2023.02); *H10K 59/1201* (2023.02); *H10K 59/873* (2023.02); *H10K 59/8792* (2023.02)

(58) Field of Classification Search
　　None
　　See application file for complete search history.

(56) References Cited

U.S. PATENT DOCUMENTS

| 10,910,605 B2 | 2/2021 | Bae et al. | |
| 2002/0014627 A1* | 2/2002 | Sato | G02F 1/136213 |
| | | | 257/E27.111 |

(Continued)

FOREIGN PATENT DOCUMENTS

| KR | 10-0467825 B1 | 1/2005 |
| KR | 10-2006-0077480 A | 7/2006 |

(Continued)

*Primary Examiner* — Nduka E Ojeh
(74) *Attorney, Agent, or Firm* — Innovation Counsel LLP

(57) ABSTRACT

A display device according to an embodiment includes: a substrate; a transistor that is disposed on the substrate; a light emitting diode that is disposed on the substrate, and connected to the transistor; and a passivation layer that is disposed between the transistor and the light emitting diode, wherein a surface step of the passivation layer is within a range of and including 1 nm to 30 nm.

11 Claims, 22 Drawing Sheets

(56)           References Cited

U.S. PATENT DOCUMENTS

| | | | |
|---|---|---|---|
| 2010/0096988 A1* | 4/2010 | Kitabayashi ..... | H10K 59/80515 |
| | | | 445/24 |
| 2011/0084267 A1* | 4/2011 | Yamazaki .......... | H10D 30/6755 |
| | | | 257/43 |
| 2016/0071887 A1 | 3/2016 | Chao et al. | |
| 2017/0222180 A1* | 8/2017 | Sato ..................... | H10K 50/822 |
| 2019/0157627 A1 | 5/2019 | Bae et al. | |
| 2019/0355799 A1 | 11/2019 | Jeong et al. | |
| 2020/0091260 A1* | 3/2020 | Lee ....................... | H10K 50/844 |
| 2020/0127242 A1 | 4/2020 | Yang et al. | |
| 2021/0159292 A1* | 5/2021 | Zhang ................. | H10K 59/124 |
| 2022/0085340 A1* | 3/2022 | Lee ....................... | H10K 59/352 |
| 2022/0246702 A1* | 8/2022 | Choo ................. | H10K 59/1213 |

FOREIGN PATENT DOCUMENTS

| | | |
|---|---|---|
| KR | 10-1152134 B1 | 6/2012 |
| KR | 10-2015-0069879 A | 6/2015 |
| KR | 10-2016-0092826 A | 8/2016 |
| KR | 10-2017-0037074 A | 4/2017 |
| KR | 10-1758437 B1 | 7/2017 |
| KR | 10-2018-0036465 A | 4/2018 |
| KR | 10-2018-0043896 A | 5/2018 |
| KR | 10-2019-0060019 A | 6/2019 |
| KR | 10-2019-0132603 A | 11/2019 |

* cited by examiner

MANUFACTURING METHOD FOR REDUCING SURFACE STEP OF A PASSIVATION LAYER

CROSS-REFERENCE TO RELATED APPLICATION

This application is a divisional application of U.S. patent application Ser. No. 17/332,933 filed on May 27, 2021, which is based on and claims priority to and the benefit of Korean Patent Application No. 10-2020-0114909 filed in the Korean Intellectual Property Office on Sep. 8, 2020, the entire contents of which are incorporated herein by reference.

BACKGROUND

1. Field

The present disclosure relates to a display device and a manufacturing method thereof.

2. Discussion of the Background

A liquid crystal display (LCD), a plasma display panel (PDP), an organic light emitting diode (OLED) display, an electric field effect display (FED) device, an electrophoretic display device, and the like have been known.

Organic light emitting diode displays have a self-luminance characteristic, and unlike the liquid crystal displays, the thickness and the weight can be reduced because the organic light emitting diode displays do not require an additional light source. In addition, the organic light emitting diode displays have high quality characteristics such as low power consumption, high luminance, and fast response speed.

SUMMARY

Embodiments of the present disclosure provide a display device that improve display quality and a manufacturing method of the display device.

A display device according to an embodiment includes: a substrate; a transistor that is disposed on the substrate; a light emitting diode that is disposed on the substrate and connected to the transistor; and a passivation layer that is disposed between the transistor and the light emitting diode, wherein a surface step of the passivation layer is within a range of and including 1 nm to 30 nm.

The passivation layer may include a first portion that overlaps a source electrode and a drain electrode of the transistor and a second portion that does not overlap the source electrode and the drain electrode, and a surface height of the first portion may be higher than a surface height of the second portion.

The first portion of the passivation layer may be exposed and polished.

The transistor may include: a polycrystalline semiconductor that is disposed on the substrate; a first gate insulation layer that is disposed on the polycrystalline semiconductor; a driving gate electrode that is disposed on the first gate insulating layer; a second gate insulating layer that is disposed on the driving gate electrode; a first interlayer insulation layer that is disposed on the second gate insulating layer; an oxide semiconductor that is disposed on the first interlayer insulating layer; a third gate insulating layer that is disposed on the oxide semiconductor; a switching gate electrode that is disposed on the third gate insulating layer; a second interlayer insulating layer that is disposed on the switching gate electrode; a first source electrode and a first drain electrode that are disposed on the second interlayer insulating layer, and connected with the oxide semiconductor; and a second source electrode and a second drain electrode that are disposed on the second interlayer insulating layer, and connected to the polycrystalline semiconductor, and the first portion of the passivation layer may overlap the first source electrode, the first drain electrode, the second source electrode, and the second drain electrode.

The transistor may include: a polycrystalline semiconductor that is disposed on the substrate; a gate insulating layer that is disposed on the polycrystalline semiconductor; a gate electrode that is disposed on the gate insulating layer; an interlayer insulating layer that is disposed on the gate electrode; and the source electrode and the drain electrode that are disposed on the interlayer insulating layer and connected to the polycrystalline semiconductor.

The display device may further include: a touch portion that is disposed on the light emitting diode; and an anti-reflection portion that is disposed on the touch portion.

The anti-reflection portion may include a blocking layer and a color filter.

The display device may further include a thin film encapsulation layer that is disposed between the light emitting diode and the touch portion.

A manufacturing method of a display device according to an embodiment includes: forming a transistor on a substrate; stacking a passivation layer that includes a first surface step on the transistor; forming the passivation layer having an opening and a second surface step by performing exposure with an exposure mask having a first region, a second region, and a third region, each having a different light transmittance; forming the passivation layer having a third surface step by polishing the exposed passivation layer with a planarization device; and forming a light emitting diode that is connected with the transistor through the opening of the passivation layer, and a surface step of the passivation layer may be 1 nm to 20 nm.

The first region of the exposure mask may be a transmissive region where light is transmitted, the second region may be a transflective region where light is partially transmitted, and the third region may be a light blocking area that blocks light, the first region may be disposed to be overlapped with the opening of the passivation layer, and the second region may be disposed to be overlapped with the source electrode and the drain electrode of the transistor.

The first surface step may be formed to be about 300 nm to about 700 n, and the second surface step may be formed to be about 60 nm to about 90 nm.

The passivation layer may include a first portion overlapping the source electrode and the drain electrode of the transistor and a second portion that does not overlap the source electrode and the drain electrode, a surface height of the first portion may be higher than a surface height of the second portion, and the first portion of the passivation layer may be exposed through the exposure, and polished during the polishing.

According to the embodiments, the surface of the insulation layer of the display device is planarized to thereby prevent display quality deterioration due to a step of the insulation layer.

BRIEF DESCRIPTION OF THE DRAWINGS

FIG. 2A to FIG. 2E are cross-sectional views provided for description of a display device according to an embodiment.

DETAILED DESCRIPTION

Figure 1:
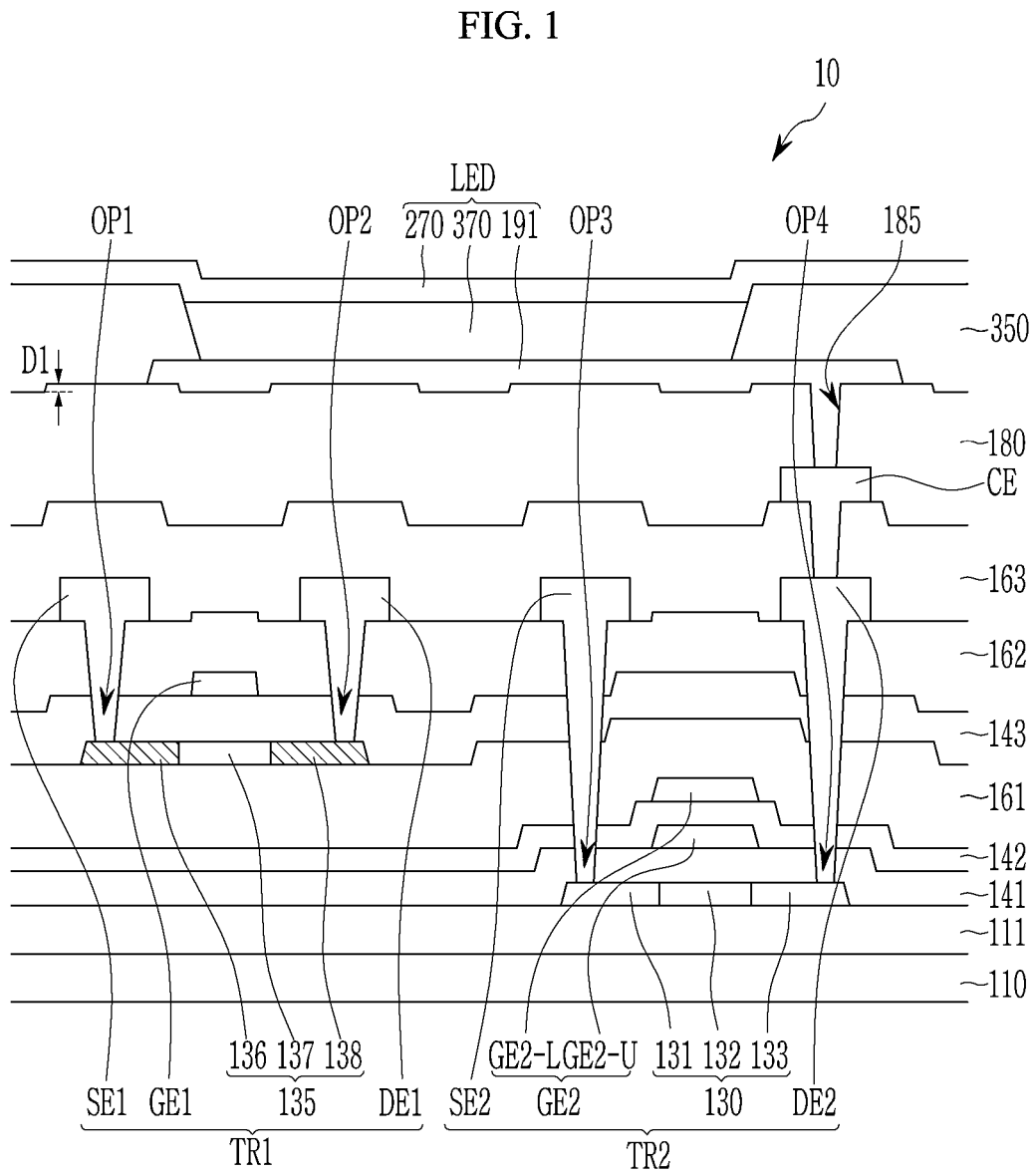
FIG. 1 is a cross-sectional view of a display device according to an embodiment.

The present invention is described more fully herein with reference to the accompanying drawings, in which embodiments of the present disclosure are shown.

As those skilled in the art would realize, the described embodiments may be modified in various ways, all without departing from the scope of the present disclosure.

The drawings and description are to be regarded as illustrative in nature and not restrictive. Like reference numerals designate like elements throughout the specification.

In the drawings, size and thickness of each element are arbitrarily illustrated for convenience of description, and the present invention is not necessarily limited to as illustrated in the drawings. In the drawings, the thickness of layers, films, panels, regions, etc., are exaggerated for clarity. In addition, in the drawings, for better understanding and ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to be positioned above or below the target element, and will not necessarily be understood to be positioned "at an upper side" based on an opposite to gravity direction.

In addition, unless explicitly described to the contrary, the word "comprise" and variations such as "comprises" or "comprising" as well as "include" and its variations mean the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

In addition, in the entire specification, the phrase "connected to" does not mean that two or more constituent elements are directly connected to, but that two or more constituent elements are indirectly connected to through other constituent elements, physically connected to, as well as electrically connected, or it is referred to by different names depending on the thing, position, or function, but it may mean that it is integral.

An embodiment of a display device is illustrated in FIG. 1. FIG. 1 is a cross-sectional view of the display device 10.

The display device 10 includes a first transistor TR1, a second transistor TR2, and a light emitting diode LED connected to the second transistor TR2. The first transistor TR1 may be a switching transistor. The second transistor TR2 may be a driving transistor. The display device 10 may include a buffer layer 111 disposed on a substrate 110.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may include a flexible material that can be bent or folded and may be provided as a single layer or may be multi-layered.

The buffer layer 111 may have a single layer or multi-layer structure. In FIG. 1, the buffer layer 111 is illustrated as a single layer but may be multi-layered according to an embodiment. The buffer layer 111 may include an organic insulating material or an inorganic insulating material. For example, the buffer layer 111 may include an inorganic insulating material such as a silicon oxide (SiOx), a silicon nitride (SiNx), and a silicon oxynitride (SiOxNy).

The second transistor TR2 may include a second semiconductor layer 130 disposed on the buffer layer 111. The second semiconductor 130 may include a polysilicon material. That is, the second semiconductor 130 may be formed of a polycrystalline semiconductor. The second semiconductor 130 may include a source region 131, a channel region 132, and a drain region 133. The source region 131 of the second semiconductor 130 may be connected to a second source electrode SE2, and the drain region 133 of the second semiconductor 130 may be connected to a second drain electrode DE2. A first gate insulating layer 141 may be disposed on the second semiconductor 130. The first gate insulating layer 141 may include a silicon oxide, a silicon nitride, and a silicon oxynitride.

A second gate lower electrode GE2-U may be disposed on the first gate insulating layer 141. The second gate lower electrode GE2-U may include molybdenum (Mo), aluminum (Al), copper (Cu), and/or titanium (Ti), and may have a single layer or multi-layer structure including the same. A second gate insulating layer 142 may be disposed on the second gate lower electrode GE2-U. The second gate insulating layer 142 may include a silicon oxide, a silicon nitride, and a silicon oxynitride. A second gate upper electrode GE2-L may be disposed on the second gate insulating layer 142. The second gate lower electrode GE2-U and the second gate upper electrode GE2-L may overlap each other, while disposing the second gate insulating layer 142 therebetween.

The second gate upper electrode GE2-L and the second gate lower electrode GE2-U form a second gate electrode GE2. The second gate electrode GE2 may overlap the channel region 132 of the second semiconductor 130 in a direction that is perpendicular to the substrate 110. The second gate upper electrode GE2-L may include molybdenum (Mo), aluminum (Al), copper (Cu), silver (Ag), chromium (Cr), tantalum (Ta), titanium (Ti), and the like, and may have a single layer or multi-layer structure including the same.

A first interlayer insulating layer 161 may be disposed on the second gate electrode GE2. The first interlayer insulating layer 161 may include a silicon oxide, a silicon nitride, and a silicon oxynitride. The first interlayer insulating layer 161 may be formed of a multilayer in which a layer containing a silicon nitride and a layer containing a silicon oxide are stacked. In this case, in the first interlayer insulating layer 161, a layer containing a silicon nitride may be positioned closer to the substrate 110 than a layer containing a silicon oxide.

The first transistor TR1 may include a first semiconductor 135 disposed on the first interlayer insulating layer 161. The first semiconductor 135 may be formed of an oxide semiconductor. The oxide semiconductor may include at least one of one-element metal oxides such as indium oxide (In), tin oxide (Sn), or zinc oxide (Zn), binary metal oxides such as In—Zn oxide, Sn—Zn oxide, Al—Zn oxide, Zn—Mg oxide, Sn—Mg oxide, In—Mg oxide, or In—Ga oxide, ternary metal oxides such as In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, or In—Lu—Zn oxide, and quaternary metal oxides such as In—Sn—Ga—Zn oxide, In—Hf—Ga—Zn oxide, In—Al—Ga—Zn oxide, In—Sn—Al—Zn oxide, In—Sn—Hf—Zn oxide, or In—Hf—Al—Zn oxide. For example, the first semiconductor 135 may include Indium-Gallium-Zinc Oxide (IGZO) among In—Ga—Zn-based oxides.

The first semiconductor 135 may include a source region 136, a channel region 137, and a drain region 138. The source region 136 of the first semiconductor 135 may be connected to the first source electrode SE1, and the drain region 138 of the first semiconductor 135 may be connected to the first drain electrode DE1.

A third gate insulating layer 143 may be disposed on the first semiconductor 135. The third gate insulating layer 143 may include a silicon oxide, a silicon nitride, and a silicon oxynitride. In the embodiment of FIG. 1, the third gate insulating layer 143 may be disposed on the entire surface of the first semiconductor 135 and the first interlayer insulating layer 161. Accordingly, the third gate insulating layer 143 covers the top and side surfaces of the source region 136, the channel region 137, and the drain region 138 of the first semiconductor 135.

In the process of implementing high resolution, the size of each pixel decreases, and accordingly, a length of a channel of the semiconductor decreases. In this case, when the third gate insulating layer 143 does not cover the top surfaces of the source region 136 and the drain region 138, some material of the first semiconductor 135 may move to the side of the third gate insulating layer 143. For example, when the first semiconductor 135 is formed of a semiconductor oxide including indium, indium particles may be positioned at the side of the third gate insulating layer 143 and the first semiconductor 135 and the first gate electrode GE1 may be short-circuited due to the indium particles. In the present embodiment, the third gate insulating layer 143 is positioned on the entire surface on the first semiconductor 135 and the first interlayer insulating layer 161, thereby preventing a short circuit between the first semiconductor 135 and the first gate electrode GE1.

In an embodiment the third gate insulating layer 143 may not be disposed on the entire surface on the first semiconductor 135 and the first interlayer insulating layer 161. For example, the third gate insulating layer 143 may be disposed only between the first gate electrode GE1 and the first semiconductor 135. That is, the third gate insulating layer 143 may overlap the channel region 137 of the first semiconductor 135 and may not overlap the source region 136 and the drain region 138.

The first gate electrode GE1 may be disposed on the third gate insulating layer 143. The first gate electrode GE1 may overlap the channel region 137 of the first semiconductor 135 in a direction that is perpendicular to the substrate 110. The first gate electrode GE1 may include molybdenum (Mo), aluminum (Al), copper (Cu), and/or titanium (Ti), and may have a single layer or multi-layer structure including the same. For example, the first gate electrode GE1 may include a lower layer containing titanium and an upper layer containing molybdenum, and the lower layer containing titanium prevents the diffusion of fluorine (F), an etching gas, during dry etching of the upper layer.

A second interlayer insulating layer 162 may be disposed on the first gate electrode GE1. The second interlayer insulating layer 162 may include a silicon oxide, a silicon nitride, and a silicon oxynitride. The second interlayer insulating layer 162 may be formed of a multilayer in which a layer containing a silicon nitride and a layer containing a silicon oxide are stacked.

The first source electrode SE1, the first drain electrode DE1, the second source electrode SE2, and the second drain electrode DE2 may be disposed on the second interlayer insulating layer 162. A first opening OP1, a second opening OP2, a third opening OP3, and a fourth opening OP4 may be formed in the second interlayer insulating layer 162. The first opening OP1 may overlap the first source electrode SE1, and the second opening OP2 may overlap the first drain electrode DE1. The third opening OP3 may overlap the second source electrode SE2, and the fourth opening OP4 may overlap the second drain electrode DE2. The first source electrode SE1 may be connected with the source region 136 of the first semiconductor 135 through the first opening OP1. The first drain electrode DE1 may be connected with the drain region 138 of the first semiconductor 135 through the second opening OP2. The second source electrode SE2 may be connected with the source region 131 of the second semiconductor 130 through the third opening OP3. The second drain electrode DE2 may be connected with the drain region 133 of the second semiconductor 140 through the fourth opening OP4.

The first source electrode SE1, the first drain electrode DE1, the second source electrode SE2, and the second drain electrode DE2 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may be a single layer or multi-layer structure including the same. For example, the first source electrode SE1, the first drain electrode DE1, the second source electrode SE2, and the second drain electrode DE2 may have a triple-layer structure including a lower layer containing refractory metals such as molybdenum, chromium, tantalum, and titanium or an alloy thereof, an interlayer containing an aluminum-based metal with low resistivity, a silver-based metal, and a copper-based metal, and an upper layer containing refractory metals such as molybdenum, chromium, tantalum, and titanium.

A third interlayer insulating layer 163 may be disposed on the first source electrode SE1, the first drain electrode DE1, the second source electrode SE2, and the second drain electrode DE2. The third interlayer insulating layer 163 may include a silicon oxide, a silicon nitride, and a silicon oxynitride. The third interlayer insulating layer 163 may be formed of a multilayer in which a layer containing a silicon nitride and a layer containing a silicon oxide are stacked. However, the third interlayer insulating layer 163 may be an organic layer. For example, the third interlayer insulating layer 163 may contain an organic insulating material such as a general purpose polymer such as polymethylmethacrylate (PMMA) or polystyrene (PS), a polymer derivative having a phenolic group, an acryl-based polymer, an imide polymer, polyimide, acryl-based polymer, a siloxane-based polymer, and the like.

A connection electrode CE and a data line (not shown) may be disposed on the third interlayer insulating layer 163. The connection electrode CE and the data line may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single layer or a multi-layer structure. The connection electrode CE disposed on the third interlayer insulating layer 163 may be connected with the second drain electrode DE2 that is disposed below the third interlayer insulation layer 163 through an opening formed in the third interlayer insulating layer 163.

A passivation layer 180 may be disposed on the connection electrode CE and the data line. An opening 185 may be formed in the passivation layer 180. The opening 185 of the passivation layer 180 may overlap the connection electrode CE that is connected with the second drain electrode DE2. The passivation layer 180 may be an organic layer. For example, the passivation layer 180 may contain an organic insulating material such as a general purpose polymer such as polymethylmethacrylate (PMMA) or polystyrene (PS), a polymer derivative having a phenolic group, an acryl-based polymer, an imide polymer, polyimide, acryl-based polymer, a siloxane-based polymer, and the like.

A surface step D1 of the passivation layer 180 may be within about 30 nm, more specifically, within about 20 nm. For example, the surface step D1 may be 1 nm to 30 nm, more specifically 1 nm to 20 nm. That is, in the passivation layer 180 measured from the surface of the substrate 110, surface heights of portions that overlaps the first source electrode SE1, the first drain electrode DE1, the second source electrode SE2, the second drain electrode DE2, the connection electrode CE, and the data line may be higher than surface heights of other portions, and such a surface height difference may be within about 30 nm, more specifically, within about 20 nm. For example, the surface height difference may be 1 nm to 30 nm, and more specifically, 1 nm to 20 nm. The surface height described in the specification is the height measured from the surface of the substrate 110.

By maintaining the surface step D1 of the passivation layer 180 to about 30 nm or less, it is possible to prevent display quality deterioration of the display device 10 which may occur due to irregular reflection of external light incident from the outside at the step portions of the passivation layer 180 or, in other words, to improve display quality of the display device 10.

An anode 191 may be disposed on the passivation layer 180. The anode 191 may be connected with the connection electrode CE through the opening 185 of the passivation layer 180 and may be connected with the second drain electrode DE2 through the connection electrode CE. The anode 191 may be provided individually for each pixel PX. The anode 191 may include a metal such as silver (Ag), lithium (Li), calcium (Ca), aluminum (Al), magnesium (Mg), gold (Au), and the like, and may include a transparent conductive oxide (TCO) such as indium tin oxide (ITO), indium zinc oxide (IZO), and the like.

A partition 350 may be disposed on the anode 191. The partition 350 may contain an organic insulating material such as a general purpose polymer such as polymethylmethacrylate (PMMA) or polystyrene (PS), a polymer derivative having a phenolic group, an acryl-based polymer, an imide polymer, polyimide, acryl-based polymer, a siloxane-based polymer, and the like.

An opening is formed in the partition 350, and the opening of the partition 350 may overlap the anode 191. A light emitting element layer 370 may be disposed in the opening of the partition 350. The light emitting element layer 370 may include a material layer that uniquely emits light of basic colors such as red, green, and blue. The emission layer EL may have a structure in which a plurality of material layers emitting light of different colors are stacked. The light emitting element layer 370 may be formed of a low-molecular organic material or a polymer organic material such as poly(3,4-ethylenedioxythiophene) (PE-DOT) and the like. In addition, the light emitting element layer 370 may be a multi-layer including one or more of a hole injection layer (HIL), a hole transporting layer (HTL), an electron transporting layer (ETL), and an electron injection layer (EIL).

A cathode 270 may be disposed on the light emitting element layer 370 and the partition 350. The cathode 270 may be commonly provided to all pixels PX, and may receive a common voltage ELVSS. The cathode 270 may include a reflective metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), or a transparent conductive oxide (TCO) such as indium tin oxide (ITO) and indium zinc oxide (IZO).

The anode 191, the light emitting element layer 370, and the cathode 270 form the light emitting diode LED.

In an embodiment of the display device 10, the first transistor TR1, which is a part of the switching transistor, may include a semiconductor oxide, and the second transistor TR2, which is a driving transistor, may include a polycrystalline semiconductor. For high-speed driving, motion of a motion picture can be expressed more naturally by increasing the existing frequency of about 60 Hz to about 120 Hz, but this increases the driving voltage. A frequency when driving a still image can be lowered to compensate for the increased driving voltage. For example, when driving a still image, it can be driven at about 1 Hz. When the frequency is lowered, a leakage current may occur. Thus, in the display device according to the embodiment, the first transistor TR1, which is a switching transistor, includes a semiconductor oxide to thereby minimize the leakage current. In addition, the second transistor TR2, which is a driving transistor, includes a polycrystalline semiconductor, thereby having high electron mobility. That is, the switching transistor and the driving transistor include different semiconductor materials, thereby achieving more stable driving and high reliability.

In an embodiment of the display device 10, the passivation layer 180 disposed between the first transistor TR1 and the second transistor TR2, a step difference between the portions overlapping the first source electrode SE1 and the first drain electrode DE1 of the first transistor TR1, the second source electrode SE2 and the second drain electrode DE2 of the second transistor TR2, the connection electrode CE, the data line, and the other portions is smaller than about 30 nm, more specifically, within about 20 nm, such that the surface of the anode 191 of the light emitting diode LED disposed on the passivation layer 180 may not be affected by the step difference of the passivation layer 180, and accordingly, it is possible to prevent display quality deterioration of the display device, which may occur due to irregular reflection of light incident from the outside due to a surface level difference.

Although it is not illustrated, the display device may further include a thin film encapsulation layer or an encapsulation substrate that wholly covers the substrate 110, and a touch substrate that includes a touch layer or touch wiring may be disposed on the thin film encapsulation layer or the encapsulation substrate.

FIGS. 2A to 2E along with FIG. 1 illustrate the display device 10 at various steps of an embodiment of a manufacturing process of the display device 10.

Figure 2A:
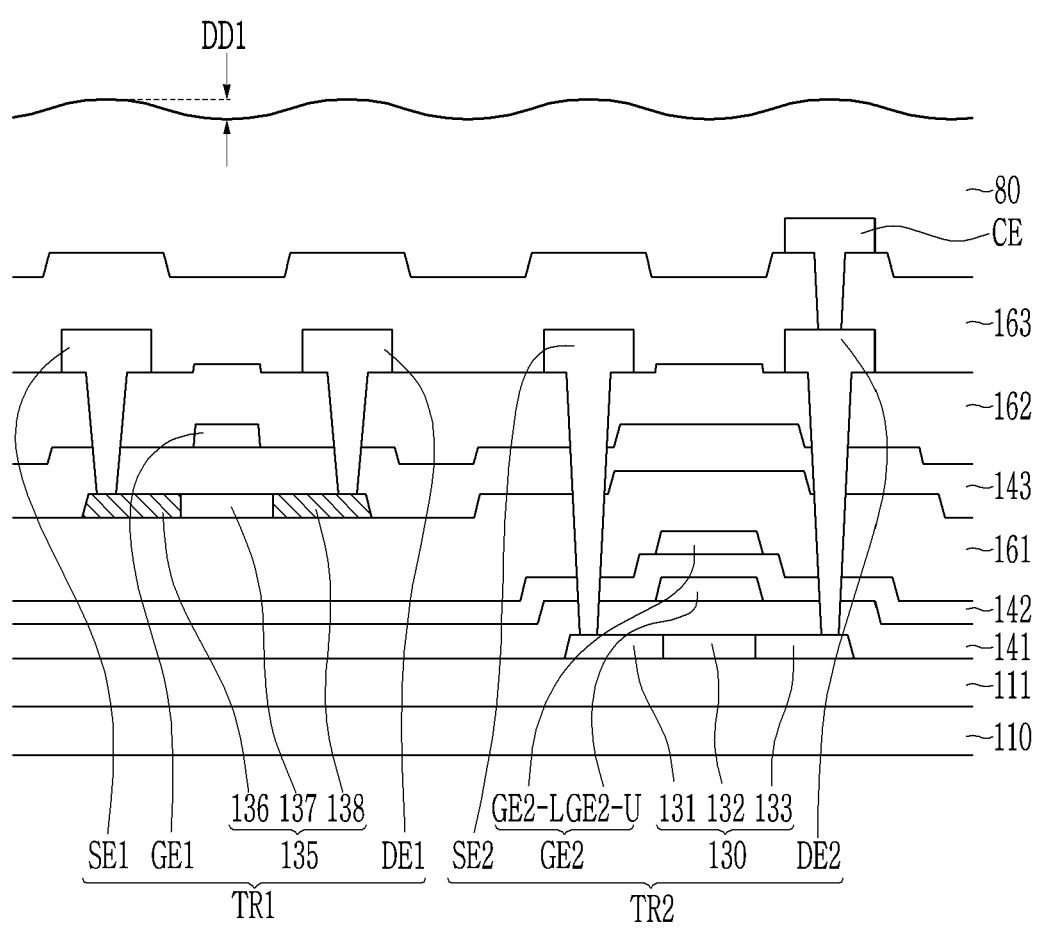

First, as shown in FIG. 2A, the first transistor TR1 and the second transistor TR2 are formed, and an insulation layer 80 that forms the passivation layer 180 is stacked on the substrate 110 where the first transistor TR and the second transistor T2 are formed.

For example, referring to FIG. 1, the forming of the first transistor TR1 and the second transistor T2 may include forming the second semiconductor 130, which is a polycrystalline semiconductor, on the substrate 110, forming the first gate insulating layer 141 on the second semiconductor 130, which is a polycrystalline semiconductor, forming the second gate lower electrode GE2-U, which is a driving electrode, on the first gate insulating layer 141, forming the second gate insulating layer 142 on the second gate lower electrode GE2-U, which is a driving gate electrode, forming the second gate upper electrode GE2-L on the second gate insulating layer 142, forming the first interlayer insulating layer 161 on the second gate upper electrode GE2-L, forming the first semiconductor 135, which is an oxide semiconductor, on the first interlayer insulating layer 161, forming the third gate insulating layer 143 on the first semiconductor 135, which is an oxide semiconductor, forming the first gate electrode GE1, which is a switching gate electrode, on the third gate insulating layer 143, forming the second interlayer insulating layer 162 on the first gate electrode GE1, which is a switching gate electrode, and forming the first source electrode SE1 and the first drain electrode DE1, which are connected to the oxide semiconductor, on the second interlayer insulating layer 162, and forming the second source electrode SE2 and the second drain electrode DE2, which are connected to the polycrystalline semiconductor. In addition, the forming of the first transistor TR1 and the second transistor T2 may further include forming the third interlayer insulating layer 163 on the second source electrode SE2 and the second drain electrode DE2, and forming the connection electrode CE and the data line on the third interlayer insulating layer 163.

The insulating layer 80 may have photosensitivity. As shown in the drawing, surface heights of portions of the passivation layer 80 stacked on the substrate 110, overlapping the first source electrode SE1, the first drain electrode DE1, the second source electrode SE2, and the second drain electrode DE2 of the first transistor TR1 and the second transistor TR2, the connection electrode CE, and the data line are high due to the step difference of the layers disposed therebelow, and a first step DD1 of the surface height of the insulating layer 80 (FIG. 2A) is larger than the surface step D1 of the passivation layer 180 of the display device 10 (FIG. 1).

Figure 2B:
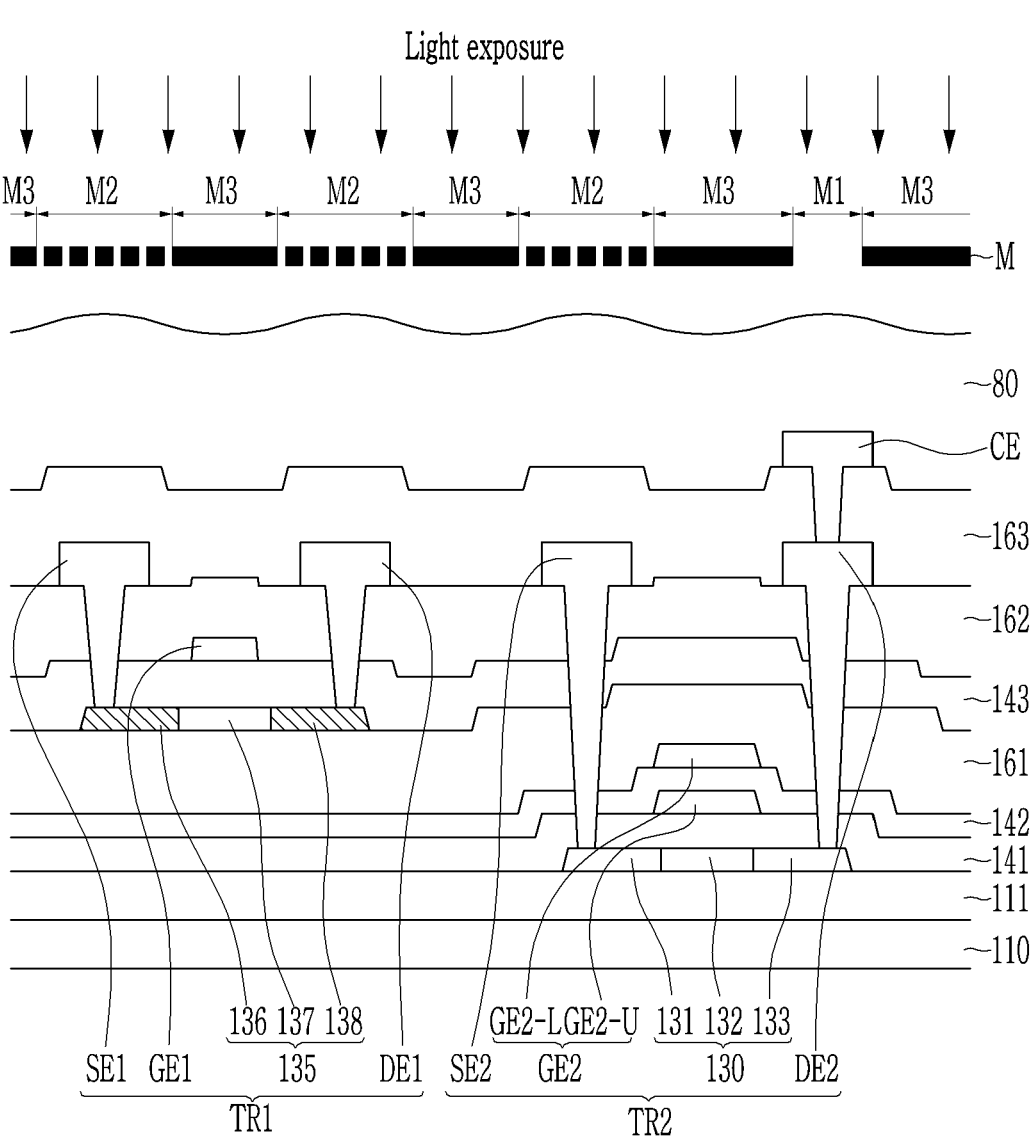

As shown in FIG. 2B, the insulating layer 80 is exposed by using an exposure mask M. The exposure mask M may be divided into a first region M1, a second region M2, and a third region M3 depending on the degree of transmission of light irradiated during exposure. For example, the first region M1 may be a transmissive region through which light is completely transmitted, the second region M2 may be a transflective region through which some light is transmitted and partly reflected, and the third region M3 may be a light blocking region that blocks light.

The insulating layer 80 may have positive photosensitivity, the first region M1 of the exposure mask M may be aligned to be overlapped with a position where the opening 185 of the passivation layer 180 is to be formed, the second region M2 of the exposure mask M may be aligned to be overlapped with the portions of the insulating layer 80 having higher surface heights, that is, the portions overlapping the first source electrode SE1, the first drain electrode DE1, the second source electrode SE2, and the second drain electrode DE2 of the first transistor TR1 and the second transistor TR2, the connection electrode CE, and the data line, and the third region M3 of the exposure mask M may be aligned to be overlapped with other portions of the insulating layer 80, not having higher surface heights.

When the insulating layer 80 has negative photosensitivity, arrangements of the first region M1 and the third region M3 of the exposure mask M may be opposite to each other.

Figure 2C:
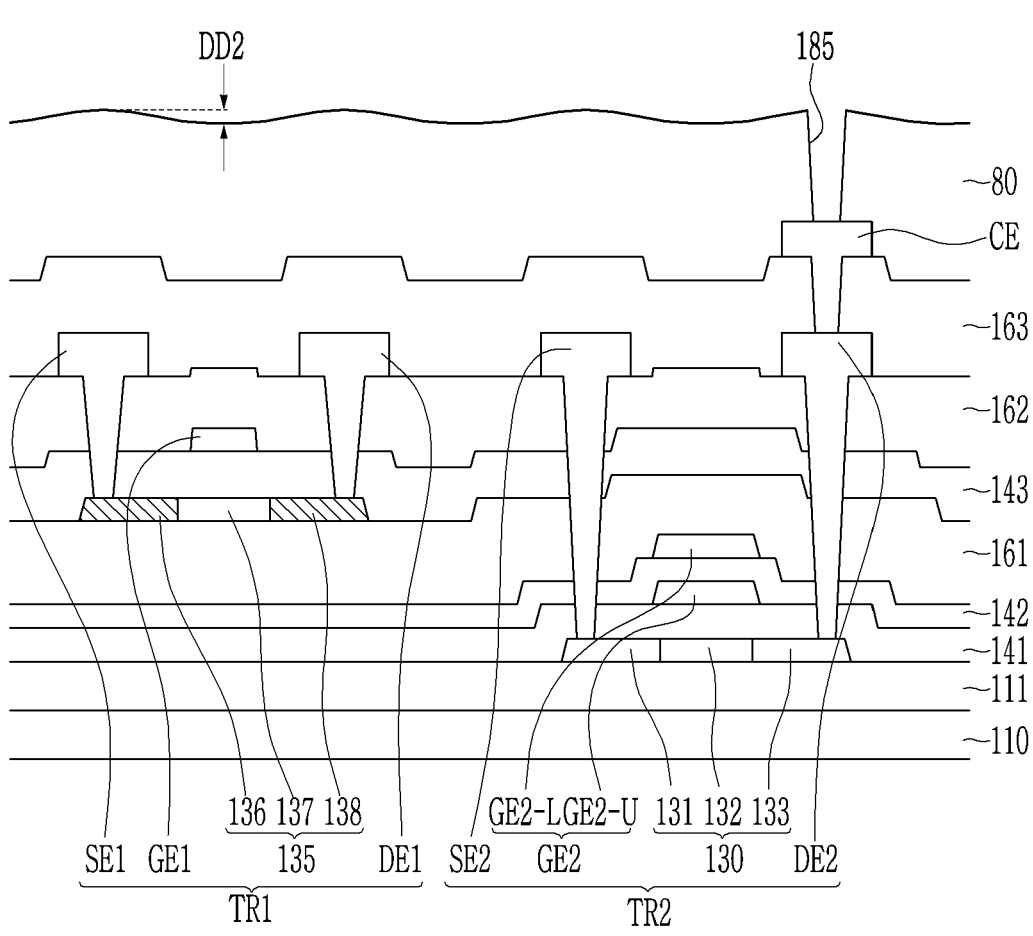

Since exposure is carried out by using such an exposure mask M, as shown in FIG. 2C, the insulating layer 80 corresponding to the first region M1 of the exposure mask M is removed and some of the insulating layer 80 corresponding to the second region M2 of the exposure mask M2 is removed. Thus, a second step DD2 between the surface height of the portions of the insulating layer 80 overlapping the first source electrode SE1, the first drain electrode DE1, the second source electrode SE2, and the second drain electrode DE2 of the first transistor TR1 and the second transistor TR2, the connection electrode CE, and the data line, and the surface height of the other portion, may be smaller than the first step DD1.

For example, the first step DD1 of the insulating layer 80 may be about 300 nm to about 700 nm, and the second step DD2 may be about 60 nm to about 90 nm.

As described, the insulating layer 80 is stacked, and the surface step of the insulating layer 80 can be reduced by using the second region M2, which is a transflective region of the exposure mask M during the exposure process for forming the opening 185 of the passivation layer 180, thereby reducing the final surface step of the passivation layer 180 without increasing manufacturing cost.

Figure 2D:
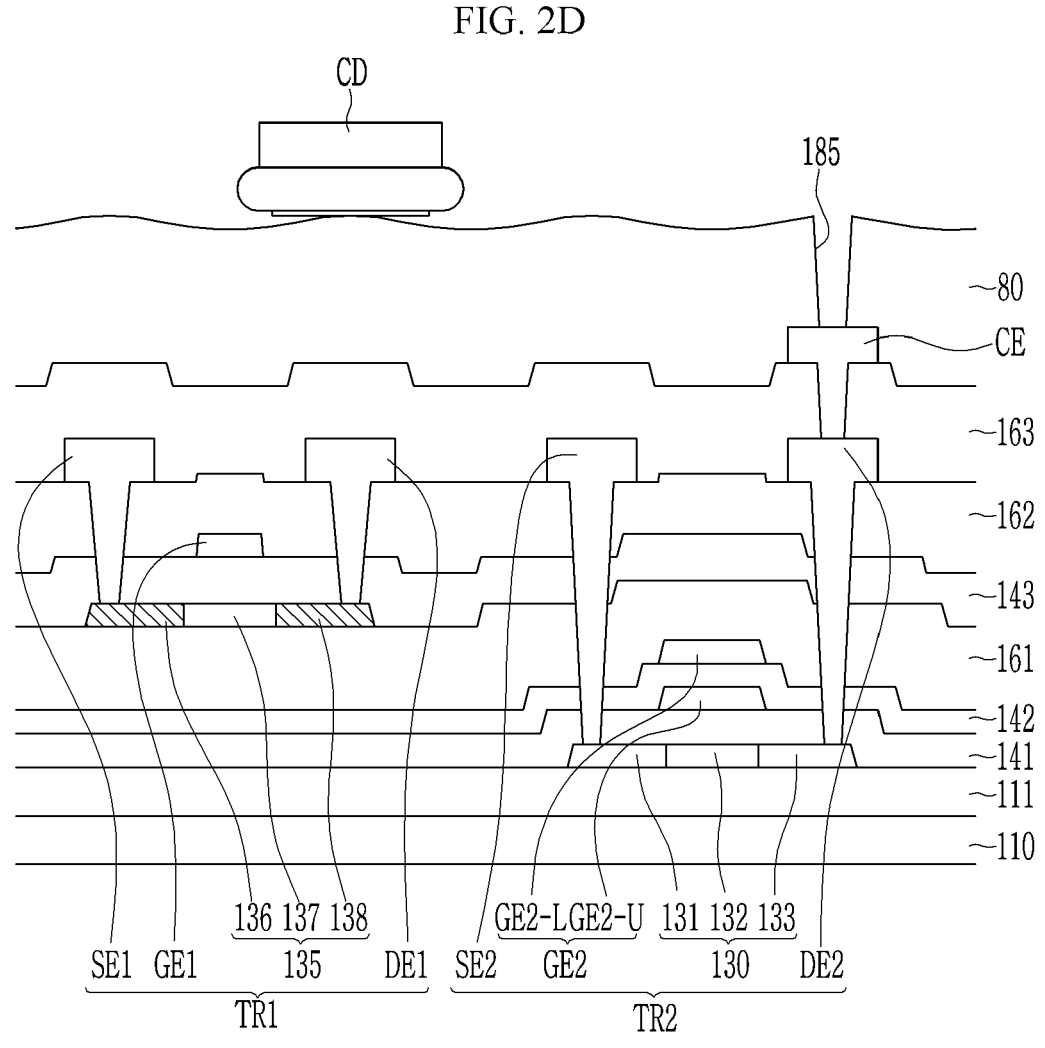
Figure 2E:
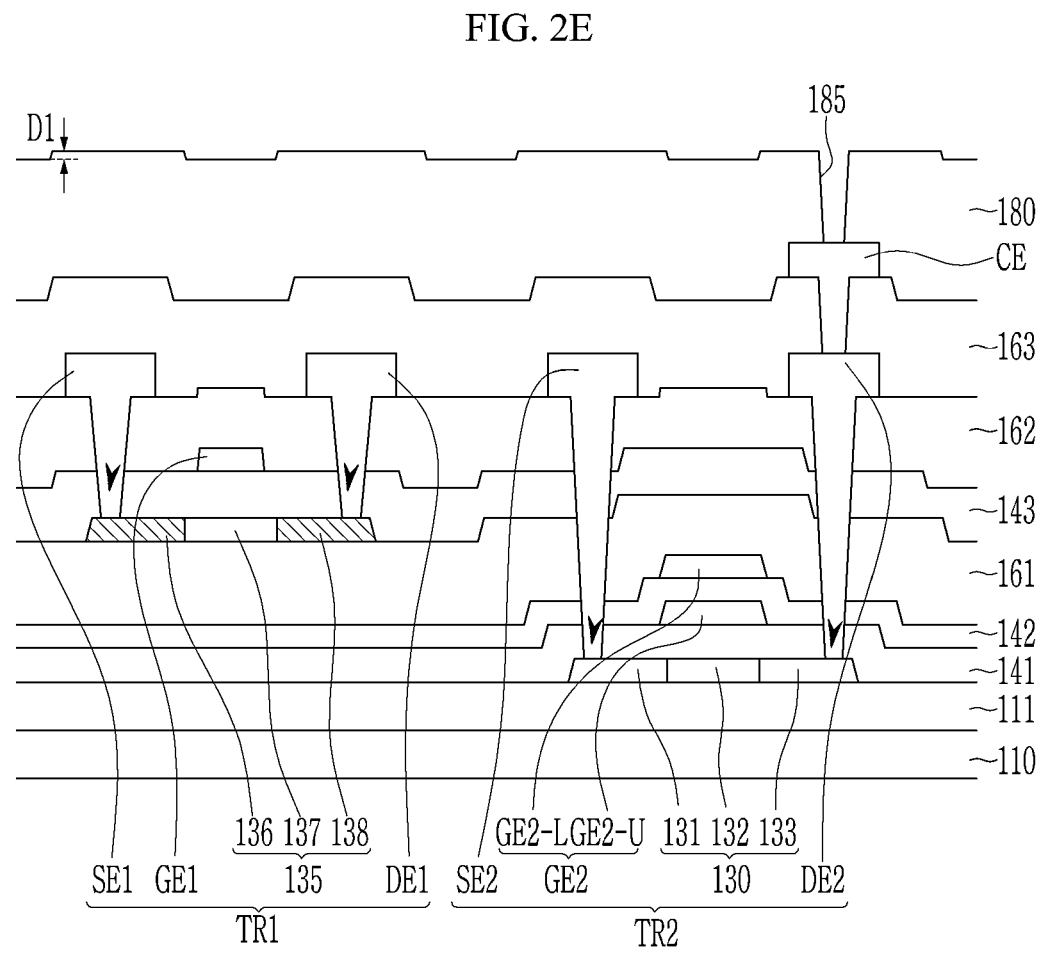

Next, as shown in FIG. 2D, the surface of the insulating layer 80 is polished by using a planarization device CD to further reduce the second surface step difference DD2 of the insulation layer 80, and thus as shown in FIG. 2E, the passivation layer 180 having the opening 185 and the surface step D1 within about 30 nm, more specifically within about 20 nm, is formed. For example, the surface step D1 may be 1 nm to 30 nm, more specifically 1 nm to 20 nm.

In an embodiment of the manufacturing process of the display device 10, the insulating layer 80 is stacked, and in the exposure process to form the opening 185 of the passivation layer 180, a first stage process for reducing the surface step of the insulating layer 80 by using the second region M2, which is the transflective region of the exposure mask M, is performed, and then, a second stage process is used to further reduce the step difference of the insulating layer 80 by polishing the surface of the layer 80 using the planarization device CD, thereby effectively forming the passivation layer 180 having a small step D1.

When the step of the passivation layer 180 is reduced only through the first stage process using the transflective region of the exposure mask, it may be difficult to reduce only the height of the region where the step occurs due to a resolution limit of the exposure mask. Particularly, as the resolution of the display device increases, the size of the transistor decreases, and a width of a part where the step difference of the passivation layer 180 occurs is narrowed, and accordingly, it is difficult to accurately reduce the step through the first stage using the transflective region of the exposure mask.

In addition, when the step of the passivation layer 180 is reduced only through a second stage of reducing the step of the insulation insulating layer 80 by polishing the surface of the insulating layer 80 using the planarization device CP, the surface of the insulating layer 80 needs to be polished for a long time to sufficiently remove the first stage DD1 formed after stacking the insulation insulating layer 80, thereby increasing the manufacturing cost and time required for manufacturing.

In an embodiment of the manufacturing process of the display device 10, the step of the passivation layer 180 is primarily reduced through the first stage process using the transflective region of the exposure mask, and then the step of the passivation layer 180 is secondarily reduced through the second stage process during which the surface of the insulating layer 80 is polished by using the planarization device CD such that the surface step of the passivation layer 180 can be reduced in a short time without increasing the manufacturing cost.

Next, the display device 10 shown in FIG. 1 can be formed by forming the anode 191, the partition 350, the light emitting element layer 370, and the cathode 270.

Although it is not illustrated, an encapsulation layer or an encapsulation substrate may be further formed, and a touch substrate that includes a touch layer or touch wiring may be further formed on the encapsulation layer and the encapsulation substrate.

Figure 2F:
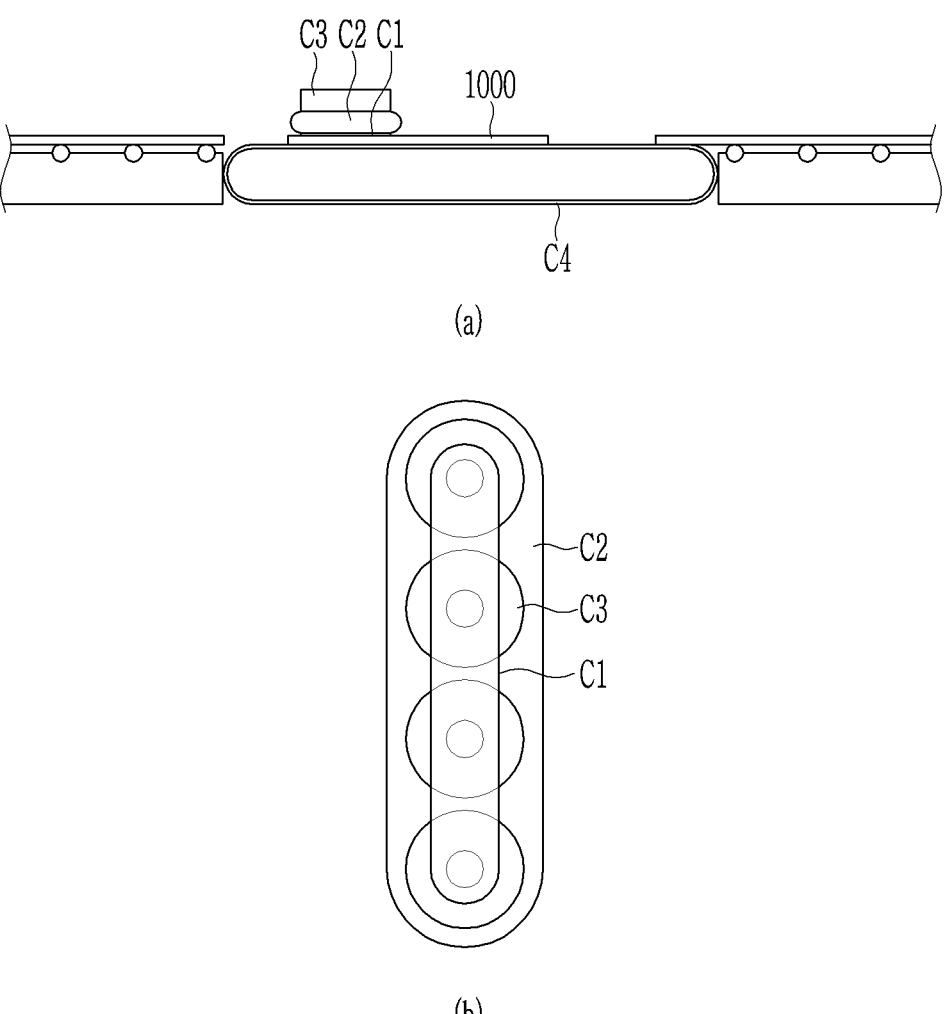
FIG. 2F schematically illustrates the planarization device used in the manufacturing method of the display device according to the embodiment.

Next, referring to FIG. 2F, an embodiment of the planarization device CD and a planarization method used in the manufacturing process of the display device 10 is described. The planarization device CD includes a polishing pad C1, a head C3 connected to the polishing pad C1, and an air tube C2 disposed between the polishing pad C1 and the head C3. Referring to (a) in FIG. 2F, as a processing substrate 100 which has undergone a pre-process is moved by a conveyor belt C4, the head C3 of the planarization device CD rotates, and accordingly, the polishing pad C1 moves to proceed with the polishing process. Since the polishing pad C1 of the planarization device CD has a bar shape, polishing can be performed to reduce a step difference in a narrow region. In addition, since the polishing process can be performed in a line process and an in-line method of the processed substrate 100, the manufacturing process becomes simple.

Figure 3:
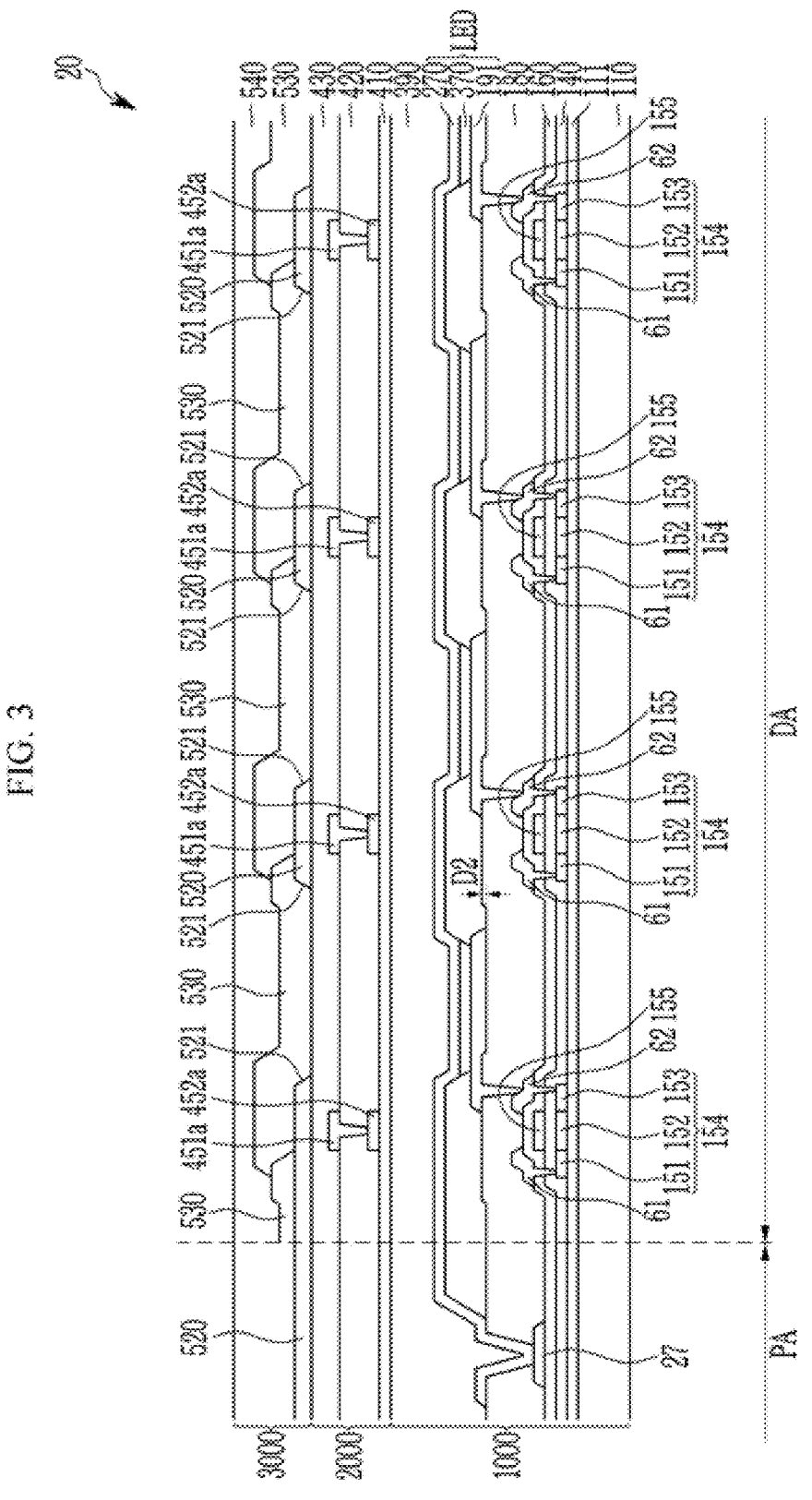
FIG. 3 is a cross-sectional view of a display device according to another embodiment.

An embodiment of a display device is illustrated in FIG. 3. The display device 20 includes a display portion 1000, a touch portion 2000, and an anti-reflection portion 3000. The touch portion 2000 may be disposed between the display portion 1000 and the anti-reflection portion 3000. The display device 10 includes a display area DA and a peripheral area PA.

The display portion 1000 includes a substrate 110, and a buffer layer 111 is disposed on the substrate 110. The substrate 110 may include a flexible material such as a plastic that can be bent, bent, folded, or rolled. The buffer layer 111 may include a silicon oxide, a silicon nitride, and a silicon oxynitride. The buffer layer 111 is disposed between the substrate 110 and the semiconductor layer 154 to block impurity from the substrate 110 during the crystallization process to form a polysilicon to improve the characteristics of the polysilicon, and stress of a semiconductor layer 154 formed on the buffer layer 111 can be relieved by flattening the substrate 110.

The semiconductor layer 154 is disposed on the buffer layer 111. The semiconductor layer 154 may be formed of a polysilicon or an oxide semiconductor. The semiconductor layer 154 includes a channel region 152, a source region 151, and a drain region 153. The source region 151 and the drain region 153 are respectively disposed at opposite sides of the channel region 152. The channel region 152 is an intrinsic semiconductor in which impurity is not doped, and the source region 151 and drain region 153 are impurity semiconductors in which a conductive impurity is doped. The semiconductor layer 154 may be formed of an oxide semiconductor, and in this case, a separate protective layer (not shown) may be added to protect an oxide semiconductor material that is vulnerable to external environments such as a high temperature.

A gate insulating layer 140 is disposed on the semiconductor layer 154 to cover the semiconductor layer 154. The gate insulating layer 140 may be a single layer or multi-layer including a silicon nitride, a silicon oxide, a silicon oxynitride, and the like. A gate electrode 155 is disposed on the gate insulating layer 140. The gate electrode 155 may be a multilayer in which a metal film including any one of copper (Cu), a copper alloy, aluminum (Al), an aluminum alloy, molybdenum (Mo), and a molybdenum alloy is stacked.

An interlayer insulating layer 160 is disposed on the gate electrode 155 and the gate insulating layer 140. The interlayer insulating layer 160 may be a single layer or multilayer including a silicon nitride, a silicon oxide, a silicon oxynitride, and the like. In the interlayer insulating layer 160, openings that respectively expose the source region 151 and the drain region 153 are disposed.

A source electrode 61, a drain electrode 62, and a data line (not shown) are disposed on the interlayer insulating layer 160. The source electrode 61 and the drain electrode 62 are respectively connected with the source region 151 and the drain region 153 of the semiconductor layer 154 through the openings formed in the interlayer insulating layer 160 and the gate insulating layer 140.

A passivation layer 180 is disposed on the interlayer insulating layer 160, the source electrode 61, and the drain electrode 62. The passivation layer 180 may be an organic layer. For example, the passivation layer 180 may contain an organic insulating material such as a general purpose polymer such as polymethylmethacrylate (PMMA) or polystyrene (PS), a polymer derivative having a phenolic group, an acryl-based polymer, an imide polymer, polyimide, acryl-based polymer, a siloxane-based polymer, and the like.

A surface step D2 of the passivation layer 180 may be within about 30 nm, more specifically, within about 20 nm. More specifically, in the passivation layer 180, a surface height of portions that overlaps the source electrode 61, the drain electrode 62, and the data line may be higher than a surface height of the remaining portions, and such a surface height difference may be within about 30 nm, more specifically, within about 20 nm. For example, the surface difference D2 of the passivation layer 180 may be 1 nm to 30 nm, and more specifically, may be 1 nm to 20 nm.

By maintaining the surface step D2 of the passivation layer 180 to about 30 nm or less, it is possible to prevent the display quality deterioration of the display device 20, which may occur due to irregular reflection of external light incident from the outside at the step portions of the passivation layer 180. In other words, by maintaining the surface step D2 of the passivation layer 180 to about 30 nm or less, the display quality of the display device 20 is improved.

An anode 191 may be disposed on the passivation layer 180. The anode electrode 191 is connected to the drain electrode 62 through an opening of the passivation layer 180. The anode 191 may be provided individually for each pixel PX. The anode 191 may contain metals such as silver (Ag), lithium (Li), calcium (Ca), aluminum (Al), magnesium (Mg), and gold (Au), or a transparent conductive oxide (TCO) such as indium tin oxide (ITO), indium zinc oxide (IZO), and the like.

A partition 350 may be disposed on the anode 191. The partition 250 may contain an organic insulating material such as a general purpose polymer such as polymethylmethacrylate (PMMA) or polystyrene (PS), a polymer derivative having a phenolic group, an acryl-based polymer, an imide polymer, polyimide, acryl-based polymer, a siloxane-based polymer, and the like.

An opening is formed in the partition 350, and the opening of the partition 350 may overlap the anode 191. A light emitting element layer 370 may be disposed in the opening of the partition 350. The light emitting element layer 370 may include a material layer that uniquely emits light of basic colors such as red, green, and blue. The emission layer EL may have a structure in which a plurality of material layers emitting light of different colors are stacked. The light emitting element layer 370 may be formed of a low-molecular organic material or a polymer organic material such as poly(3,4-ethylenedioxythiophene) (PEDOT) and the like. In addition, the light emitting element layer 370 may be a multi-layer including one or more of a hole injection layer (HIL), a hole transporting layer (HTL), an electron transporting layer (ETL), and an electron injection layer (EIL).

A cathode 270 may be disposed on the light emitting element layer 370 and the partition 350. The cathode 270 may be commonly provided to all pixels PX, and may receive a common voltage ELVSS. The cathode 270 may include a reflective metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), or a transparent conductive oxide (TCO) such as indium tin oxide (ITO) and indium zinc oxide (IZO).

The anode 191, the light emitting element layer 370, and the cathode 270 form a light emitting diode LED.

A driving transistor formed of the gate electrode 155, the semiconductor layer 154, the source electrode 61, and the drain electrode 62 is connected to the anode 191 and supplies a driving current to the light emitting diode LED. In addition to the illustrated driving transistor, the display device according to the present embodiment may further include a switching transistor (not shown) that is connected to the data line and transmits a data voltage responding to a scan signal, and a compensation transistor (not shown) that is connected to the driving transistor and compensates a threshold voltage of the driving transistor responding to the scan signal.

An encapsulation layer 390 is disposed on the cathode 270. The encapsulation layer 390 may cover not only the upper surface of the display layer 200 but also the side surface of the display layer 200 to seal the display layer 200. The encapsulation layer 390 may be disposed in front of the display area DA, and the end of the encapsulation layer 390 may be disposed in the peripheral area PA by extending from the display area DA.

Since organic light emitting elements are very vulnerable to moisture and oxygen, the encapsulation layer 390 seals the display layer 200 to block inflow of moisture and oxygen from the outside. The encapsulation layer 390 may include a plurality of layers, and may be formed as a composite layer including both an inorganic layer and an organic layer, and may be formed as a triple layer in which an inorganic layer, an organic layer, and an inorganic layer are sequentially formed.

A touch portion 2000 is disposed on the encapsulation layer 390. The touch portion 2000 may include an inorganic layer 410 disposed on the encapsulation layer 390. The inorganic layer 410 may include at least one of a metal oxide, a metal oxynitride, a silicon oxide, a silicon nitride, and a silicon oxynitride. The inorganic layer 410 covers the encapsulation layer 390 to protect the encapsulation layer 390 and prevents moisture permeation. In addition, the inorganic layer 410 may serve to reduce parasitic capacitance between the cathode 270 and a touch electrode.

A first touch cell connection 452 is disposed on the inorganic layer 410, and a first planarization layer 420 is disposed on the first touch cell connection 452.

A first touch cell 451 is disposed on the first planarization layer 420. In addition, although it is not illustrated, a second touch cell and a second touch cell connection portion may be disposed on the first planarization layer 420. Although it is not illustrated in the present embodiment, in a plan view, the first touch cell 451 and the second touch cell (not shown) are disposed neighboring each other, and the first touch cell connection portion 452 and the second touch cell connection portion (not shown) may not overlap each other.

A touch cell passivation layer 430 may be disposed on the first touch cell 451 and the second touch cell (not shown). The touch cell passivation layer 430 prevents the first touch cell 451 and the second touch cell (not shown) from being exposed to the outside and may cover the first touch cell 451 and the second touch cell (not shown) to protect the first touch cell 451 and the second touch cell (not shown). The touch cell passivation layer 430 may include inorganic materials such as a silicon nitride (SiNx) or a silicon oxide (SiOx), or organic materials such as polyacryl-based resins and polyimide resins.

The anti-reflection portion 3000 is disposed on the touch portion 2000 and may include a blocking layer 520 and a color filter 530. The blocking layer 520 overlaps the partition 350 of the display portion 1000 and may be narrower than the partition. The blocking layer 520 may be disposed over the entire peripheral area PA. The blocking layer 520 has a plurality of openings 521 overlapping an opening of the partition 350, and each opening 521 overlaps a pixel opening 365. A width of the opening 521 of the blocking layer 520 may be wider than a width of each overlapping pixel opening 365.

The color filter 530 is disposed on the blocking layer 520. Most of each color filter 530 is disposed at the opening 521 of the blocking layer 520. A second planarization layer 540 may be disposed on a plurality of color filters 530.

The anti-reflection portion 3000 prevents external light incident from the outside from being reflected by wires and the like to be visually recognized. The blocking layer 520 of the anti-reflection portion 3000 is disposed to overlap an edge of the peripheral area PA and a light emitting region of the display area DA, and absorbs incident external light to reduce it on the light emitting region. Accordingly, the degree to which external light is reflected and visually recognized can be reduced.

The color filter 530 of the anti-reflection unit 3000 reduces the visibility of external light that is incident from the outside after being reflected. Since the color filter 530 does not completely block light, it is possible to prevent reflected light of external light from being viewed without reducing the efficiency of light emitted from the light emitting element layer 370.

In general, in order to prevent the visibility of reflected light from external light, a polarization layer may be used, but in this case, the efficiency of light emitted from the organic emission layer is lowered. However, according to the embodiment, reflected light of external light can be prevented from being viewed without reducing the efficiency of light emitted from the light emitting element layer 370 by the anti-reflection portion 3000.

In the case of a display device that does not use a polarization layer, external light incident from the outside is irregularly reflected due to the surface step of the passivation layer 180 and thus the display quality deterioration of the display device may be easily recognized. However, as previously described, in the display device according to the embodiment, in the passivation layer 180 disposed between the transistor and the light emitting diode LED, a step difference between portions overlapping the source electrode 61 and the drain electrode 62, and the remaining portions is smaller than about 30 nm, more specifically, within about 20 nm, such that the surface of the anode 191 of the light emitting diode LED disposed on the passivation layer 180 may not be affected by the step difference of the passivation layer 180, and accordingly, it is possible to prevent display quality deterioration of the display device, which may occur due to irregular reflection of light incident from the outside due to a surface level difference.

FIGS. 4A to 4D along with FIG. 3 illustrate the display device 20 at various steps of an embodiment of a manufacturing process of the display device 20.

Figure 4A:
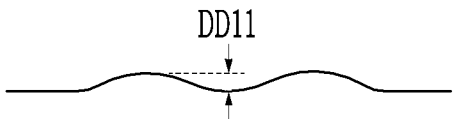
FIG. 4A to FIG. 4D are cross-sectional views provided for description of a manufacturing method of a display device according to another embodiment.
Figure 4A:
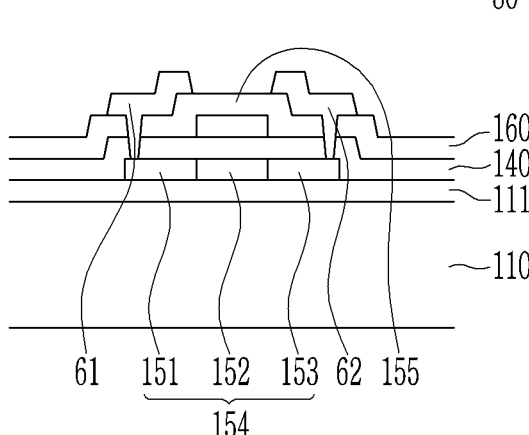

First, as shown in FIG. 4A, an insulation layer 80 that forms a passivation layer 180 is stacked on a substrate 110 where a transistor formed of a gate electrode 155, semiconductor layer 154, a source electrode 61, and a drain electrode 62 is formed.

Referring to FIG. 3, forming the transistor may include forming a polycrystalline semiconductor on the substrate, forming a gate insulation layer on the polycrystalline semiconductor, forming a gate electrode on the gate insulation layer, forming an interlayer insulation layer on the gate electrode, and forming the source electrode and the drain electrode that are disposed on the interlayer insulation layer and connected to the polycrystalline semiconductor.

The insulation layer 80 may have photosensitivity. As shown in the drawing, surface heights of the portions of the insulation layer 80 stacked on the substrate 110, overlapping the source electrode 61 and the drain electrode 62, are high due to the step difference of the layers disposed therebelow, and a first step DD11 of the surface height of the insulation layer 80 is larger than the surface step D1 of the passivation layer 180 of the display device.

Figure 4B:
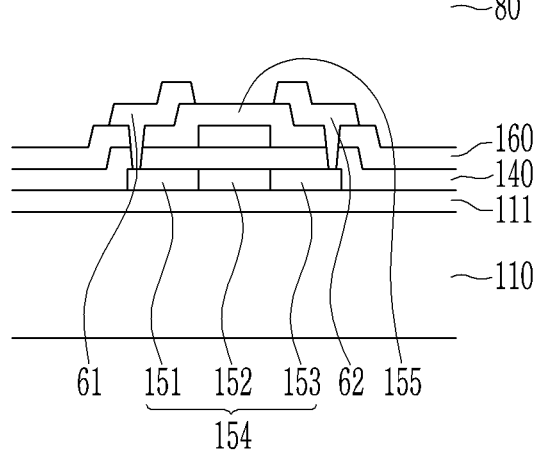

As shown in FIG. 4B, the insulation layer 80 is exposed by using an exposure mask M. The exposure mask M may be divided into a first region M1, a second region M2, and a third region M3 depending on the degree of transmission of light irradiated during exposure. For example, the first region M1 may be a transmissive region through which light is completely transmitted, the second region M2 may be a transflective region through which some light is transmitted and partly reflected, and the third region M3 may be a light-shielding region that blocks light.

The insulation layer 80 may have positive photosensitivity, the first region M1 of the exposure mask M may be aligned to be overlapped with a position where the opening 185 of the passivation layer 180 is to be formed, the second region M2 of the exposure mask M may be aligned to be overlapped with the portions of the insulation layer 80 having higher surface heights, that is, the portions overlapping the source electrode 61 and the drain electrode 62, and the third region M3 of the exposure mask M may be aligned to be overlapped with the remaining portions of the insulation layer 80, not having higher surface heights.

Figure 4C:
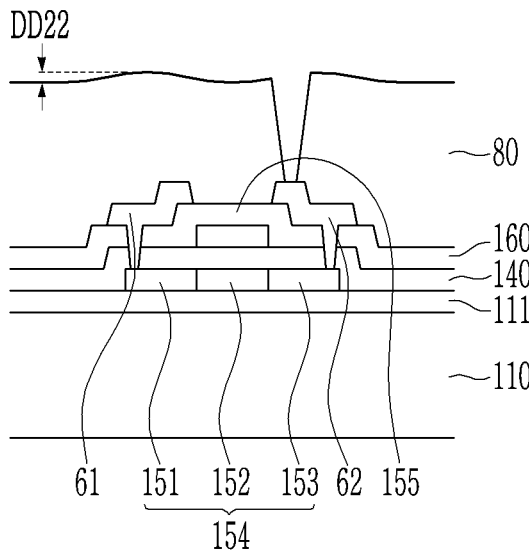

As the exposure is carried out by using such an exposure mask M, as shown in FIG. 4C, the insulation layer 80 corresponding to the first region M1 of the exposure mask M is removed and some of the insulation layer 80 corresponding to the second region M2 of the exposure mask M2 is removed. Thus, a second step DD22 between the surface height of the portions of the insulation layer 80, overlapping the source electrode 61 and the drain electrode 62, and the surface height of the remaining portion, may be smaller than the first step DD11.

For example, the first step DD11 of the insulation layer 80 may be about 300 nm to about 700 nm, and the second step DD21 may be about 60 nm to about 90 nm.

As described, the insulation layer 80 is stacked, and the surface step of the insulation layer 80 can be reduced by using the second region M2, which is a transflective region of the exposure mask M during the exposure process for forming the opening 185 of the passivation layer 180, thereby reducing the final surface step of the passivation layer 180 without increasing manufacturing cost.

Figure 4D:
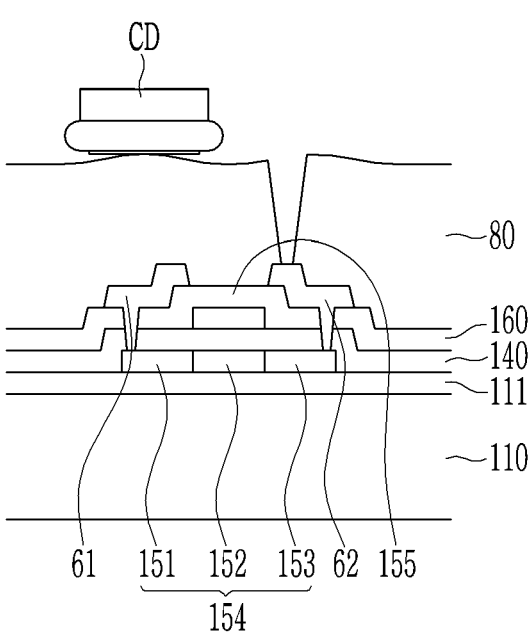

Next, as shown in FIG. 4D, the surface of the insulation layer 80 is polished by using a planarization device CD to further reduce the second surface step difference DD22 of the insulation layer 80, and thus, as shown in FIG. 3, the passivation layer 180 having the opening 185 and the surface step D2 within about 30 nm, more specifically within about 20 nm, is formed. For example, the surface step D2 may be 1 nm to 30 nm, more specifically 1 nm to 20 nm.

According to an embodiment of the manufacturing process of the display device 20, the insulation layer 80 is stacked, and in the exposure process to form the opening 185 of the passivation layer 180, a first stage process for reducing the surface step of the insulation layer 80 by using the second region M2, which is the transflective region of the exposure mask M is performed, and then a second stage process is used to further reduce the step difference of the insulation layer 80 by polishing the surface of the layer 80 using the planarization device CD, thereby effectively forming the passivation layer 180 having a small step D2.

According to an embodiment of the manufacturing process of the display device 20, the step of the passivation layer 180 is primarily reduced through the first stage process using the transflective region of the exposure mask, and then the step of the passivation layer 180 is secondarily reduced through the second stage process during which the surface of the insulation layer 80 is polished by using the planarization device CD such that the surface step of the passivation layer 180 can be reduced in a short time without increasing the manufacturing cost.

Subsequently, an anode 191, a partition 350, a light emitting element layer 370, and a cathode 270 are formed, and an encapsulation layer 390, a touch portion 2000, and an anti-reflection portion 3000 are sequentially formed thereon such that the display device 20 shown in FIG. 3 can be formed.

Results from an experimental example are shown in FIGS. 5A, 5B, 6A, and 6B, which are electron micrographs. A micrograph is a graphic reproduction of an image of an object formed by a microscope (e.g. a photograph of an image formed by a scanning electron microscope. In the present experimental example, a display device like the display device of FIG. 1 is formed, and whether or not a stepped portion on the surface of the display device is visible and whether color spread occurs due to reflection of external light was measured with respect to a first case (a) in which a surface height step of the passivation layer 190 is about 640 nm and a second case (b) in which the surface height difference of the passivation layer 180 is reduced to about 20 nm through the two stages as in the manufacturing process of the display device according to the embodiment, and the measurement results are shown by the electron micrographs.

Figure 5A:
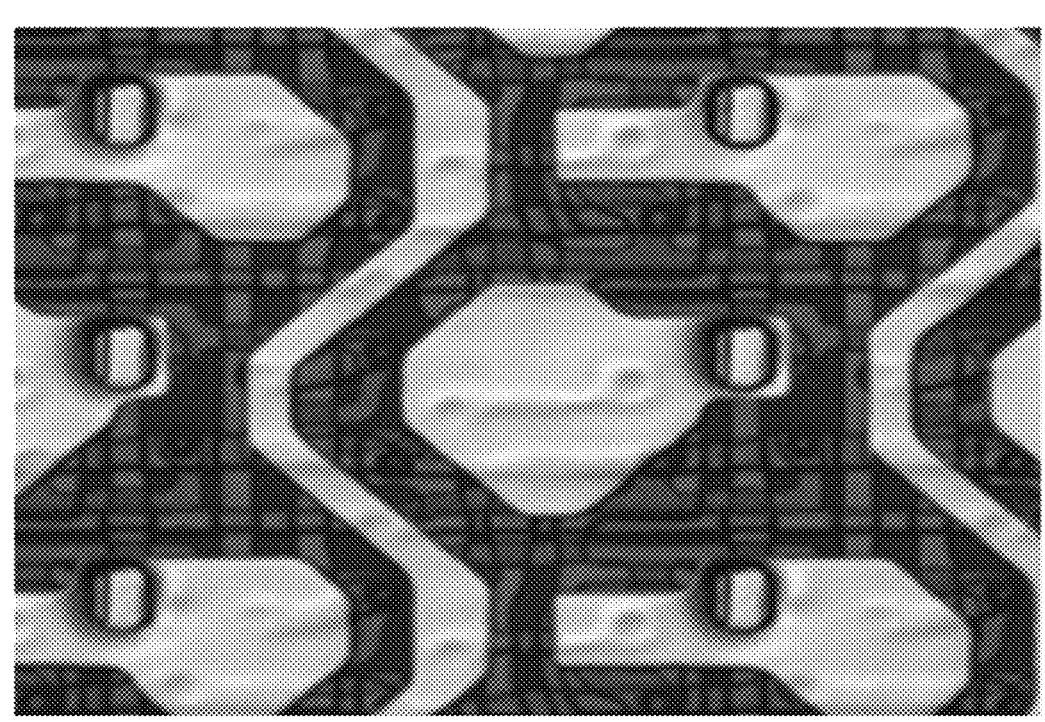
FIG. 5A and FIG. 5B are electron micrographs showing the result of an experimental example.
Figure 5B:
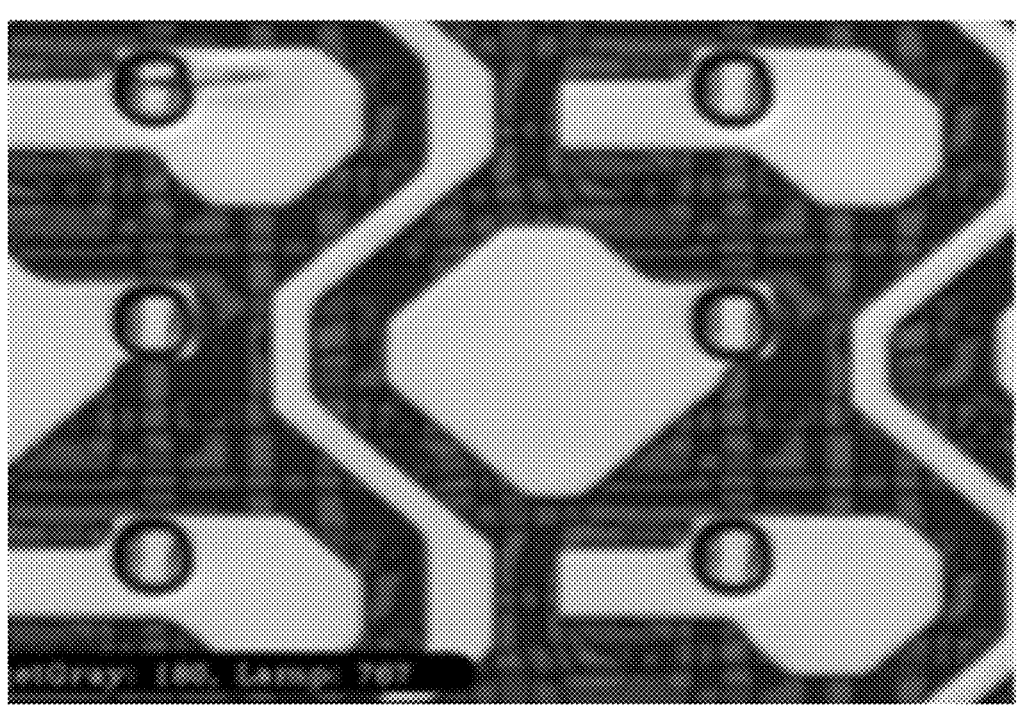
Figure 6A:
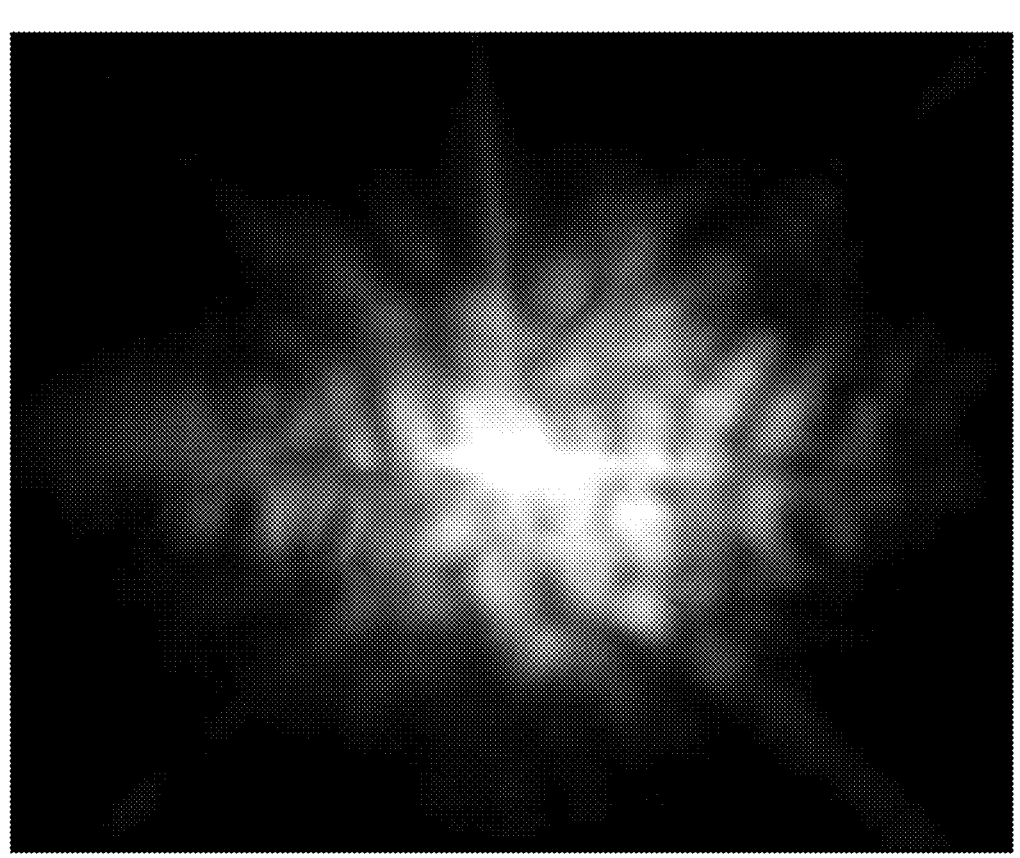
FIG. 6A and FIG. 6B are electron micrographs showing the result of an experimental example.
Figure 6B:
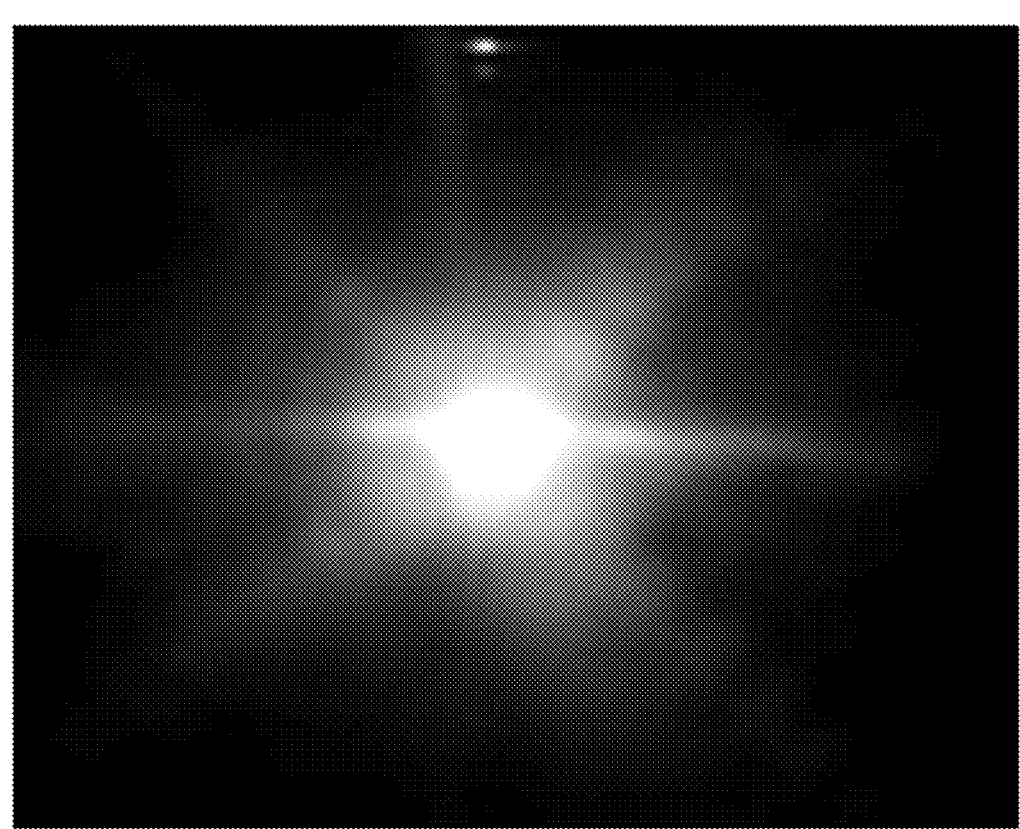

FIGS. 5A and 5B are photographs of measurement of whether the stepped portion is viewed, and FIGS. 6A 6B are photographs of measurement of color spread. FIGS. 5A and 6A respectively illustrate the result of the first case (a), and FIGS. 5B and 6B respectively illustrate the result of the second case (b).

Referring to FIGS. 5A and 5B, according to the first case (a) in which the step of the passivation layer 180 is not removed, a step due to lower wires such as a source electrode and a drain electrode was viewed at an upper surface of the display device, but as in the display device according to the embodiment, according to the second case (b) in which the surface height difference of the passivation layer 180 is reduced to about 20 nm, a step due to lower wires was not viewed at an upper surface of the display device.

In addition, referring to FIGS. 6A and 6B, according to the first case (a) in which the step of the passivation layer 180 is not removed, light bleeding occurred widely in a wide region, but according to the second case (b) in which the surface height difference of the passivation layer 180 is reduced to about 20 nm through the two stages as in the display device of the embodiment, light bleeding hardly occurred.

As described, according to the second case (b) in which the surface height difference of the passivation layer 180 is reduced to about 20 nm through the two stages as in the display device of the embodiment, it was determined that the influence of the step difference under the passivation layer 180 could be reduced, and thus display quality deterioration could be prevented.

Results from an experimental example are shown in FIGS. 7A, 7B, 8A, and 8B, which are electron micrographs. In the present experimental example, a display device like the display device of FIG. 3 is formed, and whether or not a stepped portion on the surface of the display device is visible and whether color spread occurs due to reflection of external light was measured with respect to a first case (a) in which a surface height step of the passivation layer 180 is about 640 nm and a second case (b) in which the surface height difference of the passivation layer 180 is reduced to about 20 nm through the two stages as in the manufacturing process of the display device according to the embodiment, and the measurement results are shown by the electron micrographs.

Figure 7A:
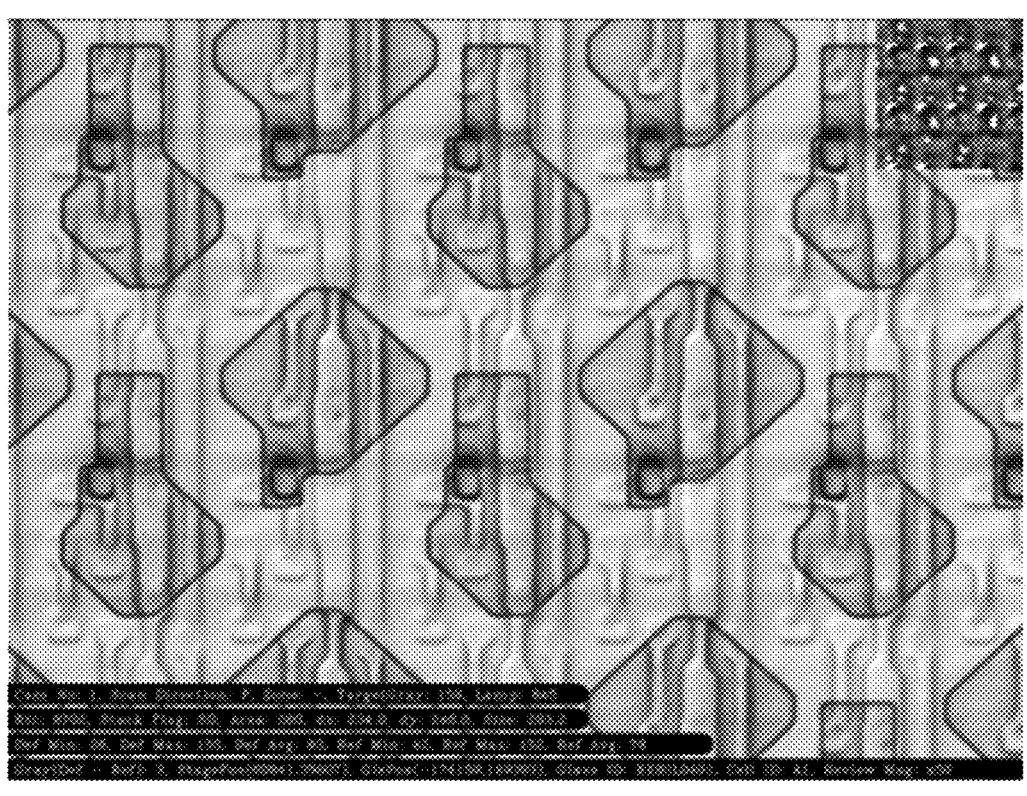
FIG. 7A and FIG. 7B are electron micrographs showing the result of an experimental example.
Figure 7B:
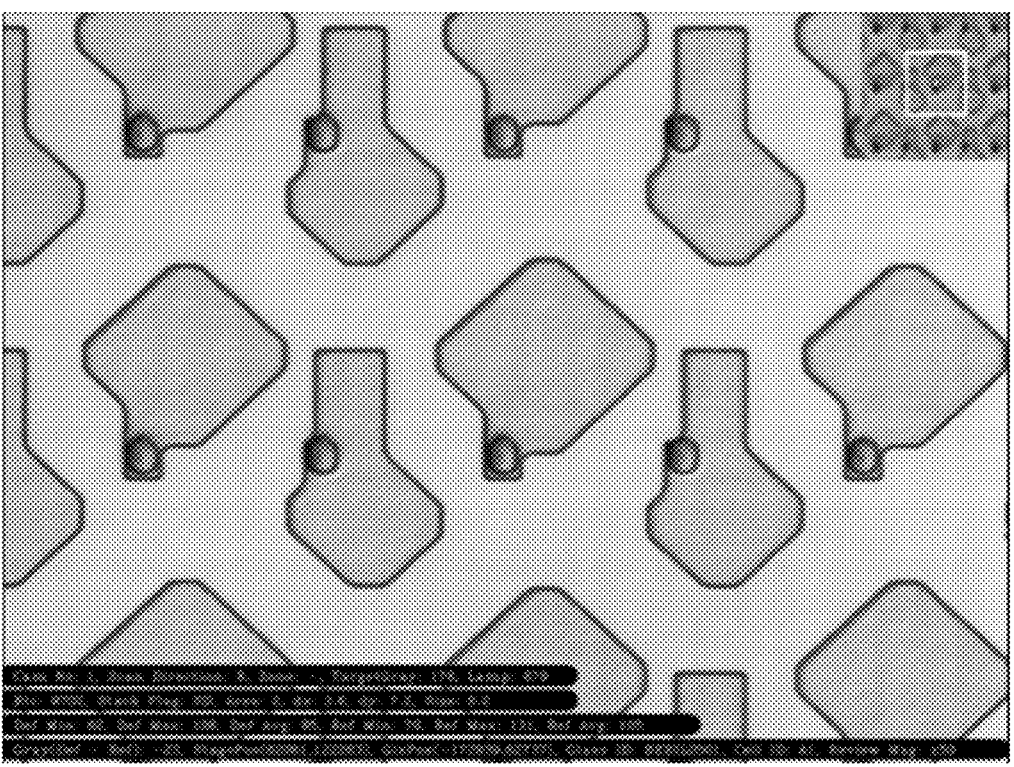
Figure 8A:
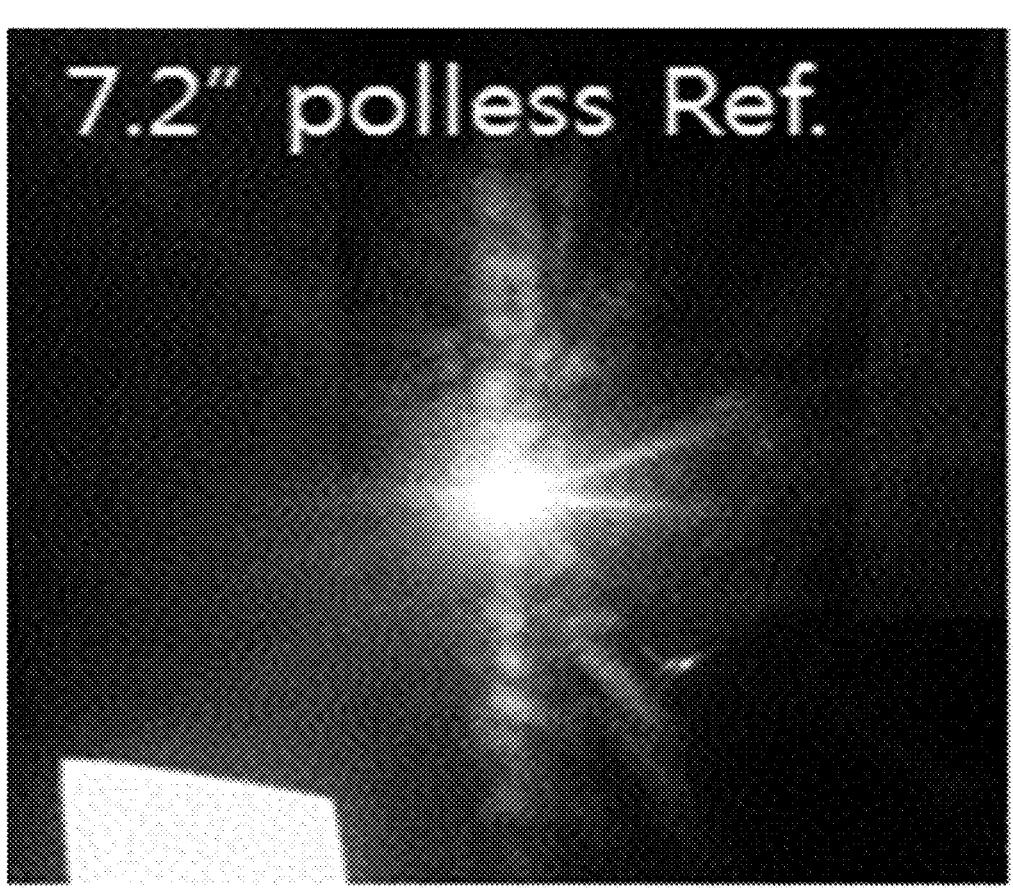
FIG. 8A and FIG. 8B are electron micrographs showing the result of an experimental example.
Figure 8B:
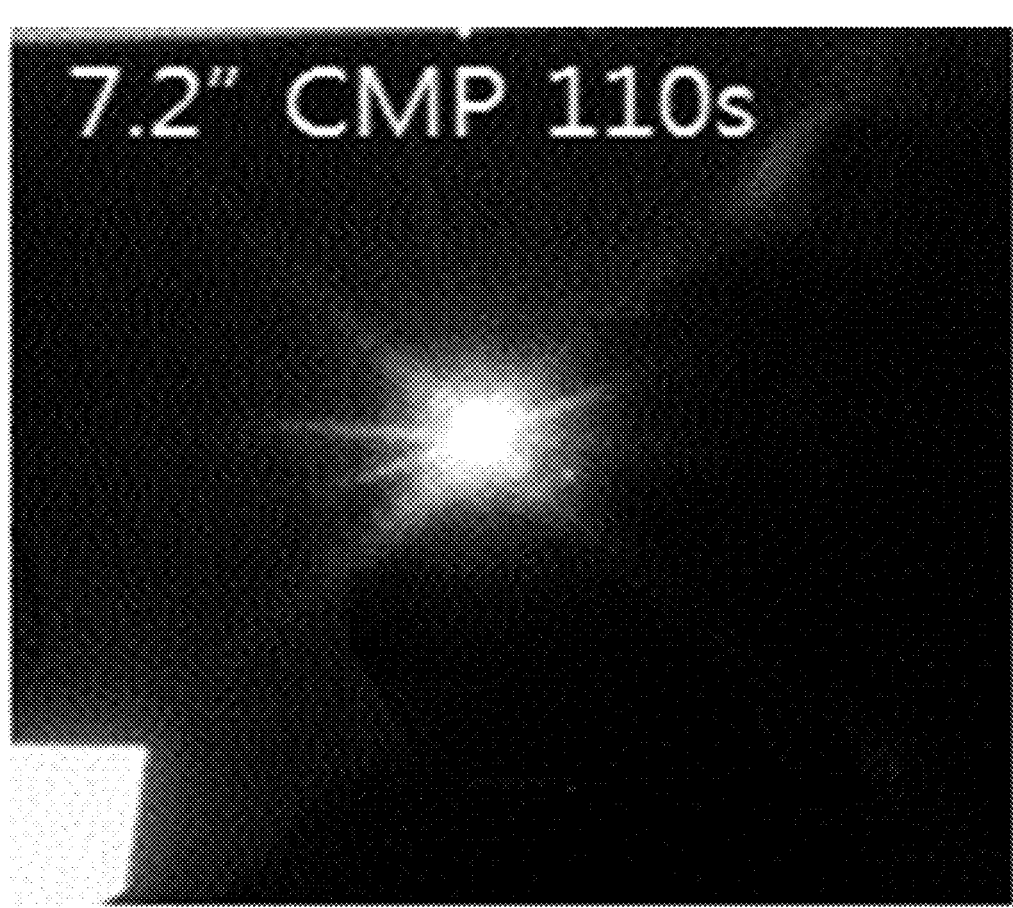

FIGS. 7A 7B are photographs of measurement of whether the stepped portion is viewed, and FIGS. 8A and 8B are photographs of measurement of color spread. FIGS. 7A and 8A respectively illustrate the result of the first case (a), and FIGS. 7B and 8B respectively illustrate the result of the second case (b).

Referring to FIGS. 7A and 7B, according to the first case (a) in which the step of the passivation layer 180 is not removed, a step due to lower wires such as a source electrode and a drain electrode was viewed at an upper surface of the display device, but as in the display device according to the embodiment, according to the second case (b) in which the surface height difference of the passivation layer 180 is reduced to about 20 nm, a step due to lower wires was not viewed at an upper surface of the display device.

In addition, referring to FIGS. 8A and 8B, according to the first case (a) in which the step of the passivation layer 180 is not removed, light bleeding occurred widely in a wide region, but according to the second case (b) in which the surface height difference of the passivation layer 180 is reduced to about 20 nm through the two stages as in the display device of the embodiment, light bleeding hardly occurred.

As described, according to the second case (b) in which the surface height difference of the passivation layer 180 is reduced to about 20 nm through the two stages as in the display device of the embodiment, it was determined that the influence of the step difference under the passivation layer 180 could be reduced, and thus display quality deterioration could be prevented.

Results from an experimental example are provided in Table 1. In the present experimental example, various display devices such as a first device to a third device are formed, and color deviation according to reflection of external light was measured with respect to a first case (a) in which a surface height step of the passivation layer 190 is about 640 nm and a second case (b) in which the surface height difference of the passivation layer 180 is reduced through the two stages as in the manufacturing method of the display device according to the embodiment, and the results are shown in Table 1.

TABLE 1

| | External light color deviation | |
| | First case (a) | Second case (b) |
|---|---|---|
| First device | 2.0 | 0.9 |
| | 0.8 | 0.7 |
| Second device | 52.8 | 33.7 |
| | 48.6 | 28.9 |
| Third device | 169.7 | 61.9 |
| | 107.5 | 40.3 |

In the case of the first device, the surface step of the passivation layer 180 was about 260 nm in the first case (a), and the surface step of the passivation layer was about 40 nm in the second case (b). In the case of the second device, the surface step of the passivation layer 180 was about 670 nm in the first case (a), and the surface step of the passivation layer was about 40 nm in the second case (b).

In the case of the third device, the surface step of the passivation layer 180 was about 700 nm in the first case (a), and the surface step of the passivation layer was about 34 nm in the second case (b).

Referring to Table 1, in the case of the first device, it was determined that external light reflection was reduced by about 34%, in the case of the second device, it was determined that external light reflection was improved by about 38%, and in the case of the third device, the external light reflection was improved by about 63%. In addition, it was determined that as the surface step difference of the passivation layer 180 decreases, the external light reflection further decreases.

As described, according to the second case (b) in which the surface height difference of the passivation layer 180 is reduced to about 20 nm through the two stages as in the display device of the embodiment, it was determined that the influence of the step difference under the passivation layer 180 could be reduced, and thus display quality deterioration could be prevented.

Figure 9A:
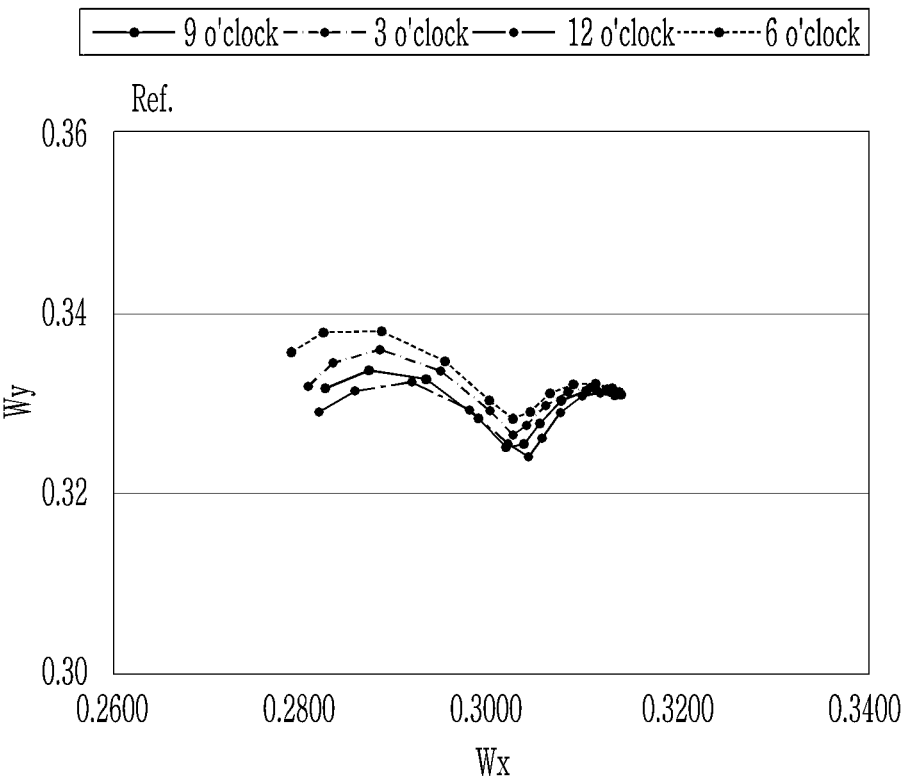
FIG. 9A and FIG. 9B are graphs illustrating results of the experimental example.
Figure 9B:
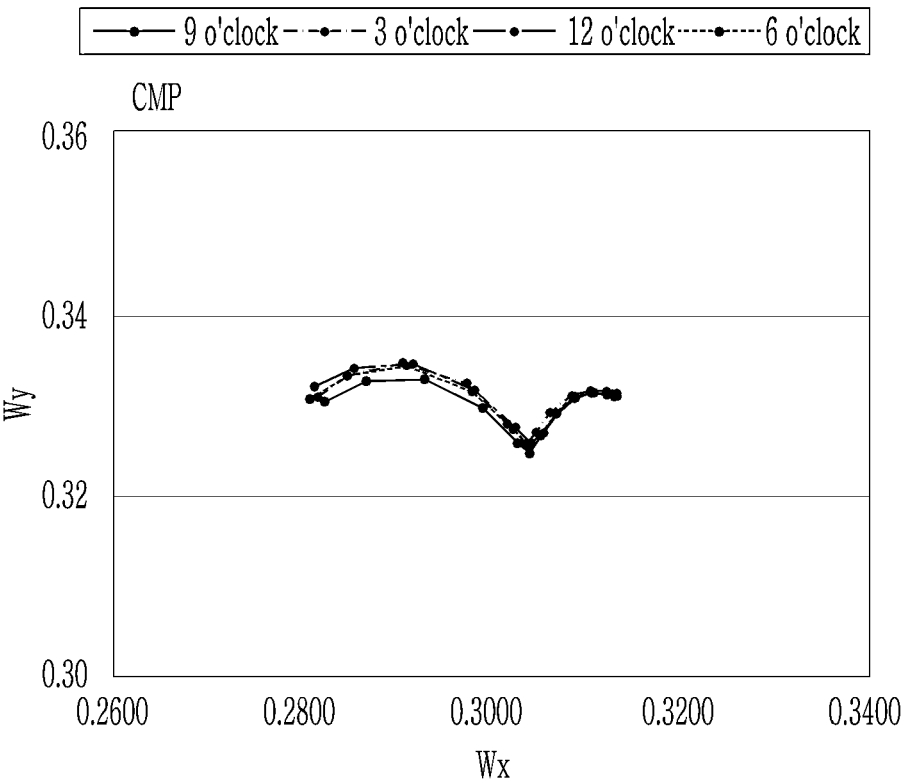

Results from an experimental example are shown in FIGS. 9A and 9B, which are graphs. In the present experimental example, a display device is formed, and white light was irradiated on the surface of the display device and the color coordinates of the reflected light according to the azimuth were measured for a first case (a) in which a surface height step of the passivation layer 180 is about 640 nm and a second case (b) in which the surface height difference of the passivation layer 180 is reduced to about 20 nm through the two stages as in the manufacturing method of the display device according to the embodiment, and the results are shown in the graphs of FIGS. 9A and 9B.

Referring to FIGS. 9A and 9B, according to the first case (a) in which the step of the passivation layer 180 is not removed, it was determined that a change in color coordinates of reflected light according to the position of the display device is large, and this can be recognized as color bleeding. On the other hand, as in the display device of the embodiment, according to the second case (b) in which the surface height difference of the passivation layer 180 is reduced to about 20 nm, it was determined that the change in the color coordinates of the reflected light according to the position of the display device was small, and accordingly, color bleeding was small.

As described, according to the second case (b) in which the surface height difference of the passivation layer 180 is reduced to about 20 nm through the two stages as in the display device of the embodiment, it was determined that the influence of the step difference under the passivation layer 180 could be reduced, and thus display quality deterioration could be prevented.

While this disclosure has been described in connection with what is presently considered to be practical embodiments, it is to be understood that the invention is not limited to the disclosed embodiments. On the contrary, it is intended to cover various modifications and equivalent arrangements included within the scope of the appended claims.

DESCRIPTION OF SYMBOLS

10, 20: display device
110: substrate
111: buffer layer
140, 141, 142, 143: gate insulating layer
160, 161, 162: interlayer insulating layer
180: passivation layer
191: anode
270: cathode
350: partition
370: light emitting element layer
390: encapsulation layer
451: touch cell
520: blocking layer
530: color filter
M: exposure mask

D1, D2, DD1, DD2, DD11, DD22: step
CD: planarization device

What is claimed is:

1. A method of manufacturing a display device, comprising:
   forming a transistor on a substrate;
   stacking a passivation layer that includes a first surface step on the transistor;
   forming the passivation layer having an opening and a second surface step by performing exposure with an exposure mask having a first region, a second region, and a third region, each having a different light transmittance;
   forming the passivation layer having a third surface step by polishing the exposed passivation layer with a planarization device; and
   forming a light emitting diode that is connected with the transistor through the opening of the passivation layer.

2. The manufacturing method of claim 1, wherein
   the first region of the exposure mask is a transmissive region where light is transmitted, the second region is a transflective region where light is partially transmitted, and the third region is a light blocking area that blocks light,
   the first region is disposed to be overlapped with the opening of the passivation layer, and
   the second region is disposed to be overlapped with a source electrode and a drain electrode of the transistor.

3. The manufacturing method of the display device of claim 2, wherein the manufacturing the transistor comprises:
   forming a polycrystalline semiconductor on the substrate;
   forming a first gate insulating layer on the polycrystalline semiconductor;
   forming a driving gate electrode on the first gate insulating layer;
   forming a second gate insulating layer on the driving gate electrode;
   forming a first interlayer insulating layer on the second gate insulating layer;
   forming an oxide semiconductor layer on the first interlayer insulating layer;
   forming a third gate insulating layer on the oxide semiconductor;
   forming a switching gate electrode on the third gate insulating layer;
   forming a second interlayer insulating layer on the switching gate electrode; and
   forming a first source electrode and a first drain electrode connected with the oxide semiconductor, and a second source electrode and a second drain electrode connected to the polycrystalline semiconductor on the second interlayer insulating layer,
   wherein the second region is disposed to be overlapped with the first source electrode, the first drain electrode, the second source electrode, and the second drain electrode.

4. The manufacturing method of the display device of claim 2, wherein the forming of the transistor comprises:
   forming a polycrystalline semiconductor on the substrate;
   forming a gate insulating layer on the polycrystalline semiconductor;
   forming a gate electrode on the gate insulating layer;
   forming an interlayer insulating layer on the gate electrode; and
   forming the source electrode and the drain electrode disposed on the interlayer insulation layer and connected to the polycrystalline semiconductor.

5. The manufacturing method of the display device of claim 4, further comprising:

forming a touch portion on the light emitting diode; and forming an anti-reflection portion on the touch portion.

6. The manufacturing method of the display device of claim 5, wherein the forming of the anti-reflection portion comprises:

forming a blocking layer on the touch portion; and forming a color filter disposed in an opening of the blocking layer.

7. The manufacturing method of the display device of claim 6, further comprising forming a thin film encapsulation layer between the light emitting diode and the touch portion.

8. The manufacturing method of the display device of claim 1, wherein the first surface step is formed to be about 300 nm to about 700 nm.

9. The manufacturing method of the display device of claim 1, wherein the second surface step is formed to be about 60 nm to about 90 nm.

10. The manufacturing method of the display device of claim 9, wherein the third surface step of the passivation layer is formed to be within a range of and including 1 nm to 30 nm.

11. The manufacturing method of the display device of claim 1, wherein the passivation layer comprises a first portion overlapping a source electrode and a drain electrode of the transistor and a second portion that does not overlap the source electrode and the drain electrode, a surface height of the first portion is higher than a surface height of the second portion, and the first portion of the passivation layer is exposed through the exposure, and polished during the polishing.

\*  \*  \*  \*  \*